United States Patent
Chen et al.

(10) Patent No.: US 12,074,706 B2
(45) Date of Patent: Aug. 27, 2024

(54) RATE-SPLITTING CONSTRUCTION OF POLAR CODED HYBRID AUTOMATIC REPEAT REQUEST (HARQ) SCHEME

(71) Applicant: QUALCOMM Incorporated, San Diego, CA (US)

(72) Inventors: Kai Chen, Shenzhen (CN); Changlong Xu, Beijing (CN); Liangming Wu, Beijing (CN); Jian Li, Beijing (CN); Jing Jiang, San Diego, CA (US); Hao Xu, Beijing (CN)

(73) Assignee: QUALCOMM Incorporated, San Diego, CA (US)

( * ) Notice: Subject to any disclaimer, the term of this patent is extended or adjusted under 35 U.S.C. 154(b) by 531 days.

(21) Appl. No.: 17/310,189

(22) PCT Filed: Jan. 23, 2019

(86) PCT No.: PCT/CN2019/072839
§ 371 (c)(1),
(2) Date: Jul. 23, 2021

(87) PCT Pub. No.: WO2020/150923
PCT Pub. Date: Jul. 30, 2020

(65) Prior Publication Data
US 2022/0140946 A1    May 5, 2022

(51) Int. Cl.
*H04L 1/08* (2006.01)
(52) U.S. Cl.
CPC ..................... *H04L 1/08* (2013.01)
(58) Field of Classification Search
None
See application file for complete search history.

(56) References Cited

U.S. PATENT DOCUMENTS

2017/0181104 A1*  6/2017  Jang .................. H03M 13/6356
2018/0248567 A1*  8/2018  Qu ......................... H03M 13/11
(Continued)

FOREIGN PATENT DOCUMENTS

CN    101242246 A    8/2008
CN    106452460 A    2/2017
(Continued)

OTHER PUBLICATIONS

Huawei, et al., "HARQ Scheme for Polar Codes", 3GPP TSG RAN WG1 Meeting #87, R1-1613301, 3rd Generation Partnership Project, Mobile Competence Centre, 650, Route Des Lucioles, F-06921 Sophia-Antipolis Cedex, France, vol. RAN WG1, No. Reno, USA, Nov. 14, 2016-Nov. 18, 2016, Nov. 19, 2016, XP051191170, 41 Pages, Section 2, figures 4,5, [Lines 4 to 5 of p. 2 and Lines 1 to 2 of p. 3], Section 2.2 "Incremental Redundancy HARQ Design", pp. 3-8, figures 5-7, Section 2.1 "Incremental Freezing HARQ design", pp. 1-3, Section 2.
(Continued)

*Primary Examiner* — Alex Skripnikov
(74) *Attorney, Agent, or Firm* — Haynes and Boone, LLP

(57) ABSTRACT

Wireless communications systems and methods related to hybrid repeat request (HARQ) with rate splitting are provided. A first wireless communication device communicates, with a second wireless communication device, a first communication signal including a plurality of information bits. The first wireless communication device determines a number of bits in the plurality of information bits to be repeated in a second communication signal based on channel capacity information. The first wireless communication device communicates, with the second wireless communication device, the second communication signal including the plurality of information bits and a repetition of a subset of the plurality
(Continued)

of information bits, where the subset of the plurality of information bits includes the determined number of bits.

26 Claims, 9 Drawing Sheets

(56) References Cited

U.S. PATENT DOCUMENTS

2019/0074928 A1\* 3/2019 Ma ................. H04L 1/0041
2019/0140663 A1\* 5/2019 Noh ................. H04L 1/007

FOREIGN PATENT DOCUMENTS

| CN | 107181576 A | 9/2017 |
| WO | 2018083302 A1 | 5/2018 |
| WO | 2019023244 A1 | 1/2019 |

OTHER PUBLICATIONS

Liang H., et al., "A Throughput-Efficient Rateless Scheme of Polar Codes", 2018 10th International Conference on Wireless Communications and Signal Processing, IEEE, Oct. 18, 2018, XP033460168, 7 Pages.
Ma L., et al., "An Incremental Redundancy HARQ Scheme for Polar Code", Aug. 31, 2017, XP055449712, pp. 1-6.
Shah Mohammadi F., et al., "Neural Network Cognitive Engine for Autonomous and Distributed Underlay Dynamic Spectrum Access", Arxiv.Org, Cornell University Library, 201 Olin Library Cornell University Ithaca, NY 14853, Jun. 28, 2018, XP081015658, pp. 1-16.
Supplementary European Search Report—EP19912069—Search Authority—Munich—Jul. 29, 2022.
International Search Report and Written Opinion—PCT/CN2019/072839—ISA/EPO—Oct. 24, 2019.
Qualcomm Incorporated: "Further Evaluation of Polar HARQ", 3GPP TSG-RAN WG1 #87, R1-1612087, Nov. 18, 2016, 12 pages.

\* cited by examiner

RATE-SPLITTING CONSTRUCTION OF POLAR CODED HYBRID AUTOMATIC REPEAT REQUEST (HARQ) SCHEME

CROSS-REFERENCE TO RELATED APPLICATIONS

This application is the U.S. national phase of International Application No. PCT/CN2019/072839, filed Jan. 23, 2019, incorporated by reference herein in its entirety.

TECHNICAL FIELD

This application relates to wireless communication systems, and more particularly to polar coded hybrid repeat request (HARQ) with rate splitting. Certain embodiments can enable and provide solutions and techniques for wireless communication devices to efficiently determine a retransmission configuration for polar coded HARQ at run-time.

INTRODUCTION

Wireless communications systems are widely deployed to provide various types of communication content such as voice, video, packet data, messaging, broadcast, and so on. These systems may be capable of supporting communication with multiple users by sharing the available system resources (e.g., time, frequency, and power). A wireless multiple-access communications system may include a number of base stations (BSs), each simultaneously supporting communications for multiple communication devices, which may be otherwise known as user equipment (UE).

To meet the growing demands for expanded mobile broadband connectivity, wireless communication technologies are advancing from the LTE technology to a next generation new radio (NR) technology. For example, NR is designed to provide a lower latency, a higher bandwidth or throughput, and a higher reliability than LTE. NR is designed to operate over a wide array of spectrum bands, for example, from low-frequency bands below about 1 gigahertz (GHz) and mid-frequency bands from about 1 GHz to about 6 GHz, to high-frequency bands such as millimeter wave (mmWave) bands. NR is also designed to operate across different spectrum types, from licensed spectrum to unlicensed and shared spectrum. Spectrum sharing enables operators to opportunistically aggregate spectrums to dynamically support high-bandwidth services. Spectrum sharing can extend the benefit of NR technologies to operating entities that may not have access to a licensed spectrum.

HARQ is widely used in wireless communication systems to provide a higher transmission reliability. In a HARQ scheme, a transmitter may transmit an encoded data packet or a codeword to a receiver. The receiver may feedback a reception status to the transmitter. For example, the receiver may transmit an acknowledgement (ACK) to indicate a successful decoding. Alternatively, the receiver may transmit a negative-ACK (NACK) to indicate a decoding failure. Upon receiving a NACK, the transmitter may retransmit the data packet in the same encoded form or a different encoded form to the receiver. The retransmission can be based on chase combing HARQ (CC-HARQ) or incremental redundancy HARQ (IR-HARQ). In a CC-HARQ scheme, the transmitter may retransmit the same encoded data packet or codeword in each retransmission. In an IR-HARQ scheme, the transmitter may incrementally transmit parts of a long codeword which may include different information bits and/or different redundant bits at each retransmission. The receiver may compute log-likelihood ratios (LLRs) for the initial transmission and the retransmission. The receiver may recover the original transmitted packet by combining the LLRs according to the corresponding HARQ scheme.

BRIEF SUMMARY OF SOME EXAMPLES

The following summarizes some aspects of the present disclosure to provide a basic understanding of the discussed technology. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

For example, in an aspect of the disclosure, a method of wireless communication includes communicating, by a first wireless communication device with a second wireless communication device, a first communication signal including a plurality of information bits. The method further includes determining, by the first wireless communication device, a number of bits in the plurality of information bits to be repeated in a second communication signal based on channel capacity information. The method further includes communicating, by the first wireless communication device with the second wireless communication device, the second communication signal including the plurality of information bits and a repetition of a subset of the plurality of information bits, the subset of the plurality of information bits including the determined number of bits.

In an additional aspect of the disclosure, an apparatus includes a transceiver configured to communicate, with a wireless communication device, a first communication signal including a plurality of information bits. The apparatus further includes a processor configured to determine a number of bits in the plurality of information bits to be repeated in a second communication signal based on channel capacity information. The transceiver is further configured to communicate, with the wireless communication device, the second communication signal including the plurality of information bits and a repetition of a subset of the plurality of information bits, the subset of the plurality of information bits including the determined number of bits.

In an additional aspect of the disclosure, an apparatus includes means for communicating, with a wireless communication device, a first communication signal including a plurality of information bits. The apparatus further includes means for determining a number of bits in the plurality of information bits to be repeated in a second communication signal based on channel capacity information. The apparatus further includes means for communicating, with the second wireless communication device, the second communication signal including the plurality of information bits and a repetition of a subset of the plurality of information bits, where the subset of the plurality of information bits including the determined number of bits.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

DETAILED DESCRIPTION

Figure 1:
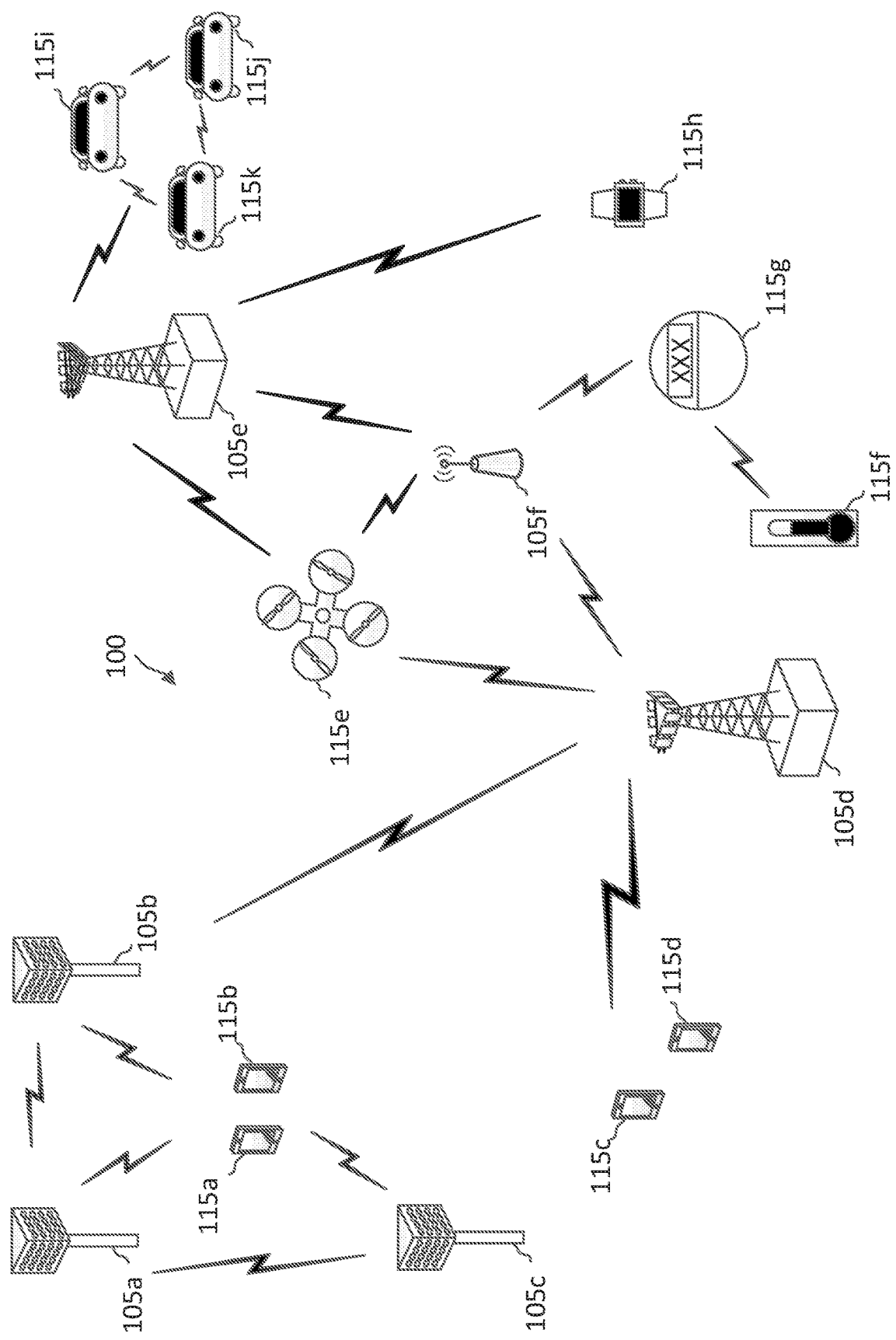
FIG. 1 illustrates a wireless communication network according to some embodiments of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

This disclosure relates generally to wireless communications systems, also referred to as wireless communications networks. In various embodiments, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, 5$^{th}$ Generation (5G) or new radio (NR) networks, as well as other communications networks. As described herein, the terms "networks" and "systems" may be used interchangeably.

An OFDMA network may implement a radio technology such as evolved UTRA (E-UTRA), IEEE 802.11, IEEE 802.16, IEEE 802.20, flash-OFDM and the like. UTRA, E-UTRA, and Global System for Mobile Communications (GSM) are part of universal mobile telecommunication system (UMTS). In particular, long term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3rd Generation Partnership Project (3GPP) is a collaboration between groups of telecommunications associations that aims to define a globally applicable third generation (3G) mobile phone specification. 3GPP long term evolution (LTE) is a 3GPP project which was aimed at improving the universal mobile telecommunications system (UMTS) mobile phone standard. The 3GPP may define specifications for the next generation of mobile networks, mobile systems, and mobile devices. The present disclosure is concerned with the evolution of wireless technologies from LTE, 4G, 5G, NR, and beyond with shared access to wireless spectrum between networks using a collection of new and different radio access technologies or radio air interfaces.

In particular, 5G networks contemplate diverse deployments, diverse spectrum, and diverse services and devices that may be implemented using an OFDM-based unified, air interface. In order to achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1M nodes/km$^2$), ultra-low complexity (e.g., ~10 s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 ms), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

The 5G NR may be implemented to use optimized OFDM-based waveforms with scalable numerology and transmission time interval (TTI); having a common, flexible framework to efficiently multiplex services and features with a dynamic, low-latency time division duplex (TDD)/frequency division duplex (FDD) design; and with advanced wireless technologies, such as massive multiple input, multiple output (MIMO), robust millimeter wave (mmWave) transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHz FDD/TDD implementations, subcarrier spacing may occur with 15 kHz, for example over 1, 5, 10, 20 MHz, and the like BW. For other various outdoor and small cell coverage deployments of TDD greater than 3 GHz, subcarrier spacing may occur with 30 kHz over 80/100 MHz BW. For other various indoor wideband implementations, using a TDD over the unlicensed portion of the 5 GHz band, the subcarrier spacing may occur with 60 kHz over a 160 MHz BW. Finally, for various deployments transmitting with mmWave components at a TDD of 28 GHz, subcarrier spacing may occur with 120 kHz over a 500 MHz BW.

The scalable numerology of the 5G NR facilitates scalable TTI for diverse latency and quality of service (QoS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink/downlink scheduling information, data, and acknowledgement in the same subframe. The self-contained integrated subframe supports communications in unlicensed or contention-based shared spectrum, adaptive uplink/downlink that may be flexibly configured on a per-cell basis to dynamically switch between uplink and downlink to meet the current traffic needs.

Various other aspects and features of the disclosure are further described below. It should be apparent that the teachings herein may be embodied in a wide variety of forms and that any specific structure, function, or both being disclosed herein is merely representative and not limiting. Based on the teachings herein one of an ordinary level of skill in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. For example, a method may be implemented as part of a system, device, apparatus, and/or as instructions stored on a computer readable medium for execution on a processor or computer. Furthermore, an aspect may comprise at least one element of a claim.

The present application describes mechanisms to efficiently determine a rate-splitting configuration for a retransmission in HARQ such that the determination can be performed in run-time within a wireless communication device. In the disclosed embodiments, a transmitter may encode a block of information bits (e.g., K bits) into a codeword and transmit the codeword in an initial transmission and selectively repeat a portion of the information bits in a subsequent transmission. The transmitter may determine an optimal number of bits to repeat based on a total length of the block of information bits, an output codeword length in the initial transmission, an output codeword length in the subsequent transmission, and/or a bias factor related to a channel capacity information associated with the initial transmission and the subsequent transmission. The channel capacity information can include modulation schemes used by the initial transmission and the subsequent transmission, signal-to-noise-ratios (SNRs) of the initial transmission and the subsequent transmission, and/or any other channel conditions (e.g., noise profiles and/or interference profiles) associated with the initial transmission and the subsequent transmission.

In an embodiment, the transmitter can apply a prediction network, a neural network, a deep learning network, or machine learning techniques to determine an optimal code rate for a retransmission. The transmitter may be preconfigured with an output codeword length for each retransmission. Thus, the transmitter may compute a number of bits (e.g., denoted as $K_2$) to repeat in a subsequent retransmission based on the determined code rate and the corresponding preconfigured output codeword length.

In an embodiment, the transmitter may apply polar encoding to encode the information bits for the initial transmission and for the subsequent retransmission. The transmitter may select the $K_2$ number of bits from the block of K bits input bits based on a transmission reliability. For example, the transmitter may select bits that are carried in resource locations that have the least transmission reliability in the initial transmission and relocate the selected bits to resource location that have the highest transmission reliability in the subsequent transmission. For the initial transmission, the transmitter may perform polar encoding on the block of input information bits and rate match to generate an output codeword for transmission. For the subsequent retransmission, the transmitting node may perform polar encoding on the repeated information bits, compute a bitwise exclusive-or (XOR) operations between the original coded bits in the initial transmission and the encoded repeated bits, and rate match to generate an output codeword for retransmission. In an embodiment, a receiver may perform similar rate splitting operations to determine a number of bits that the transmitter may repeat in a subsequent retransmission. While the disclosed embodiments are described in the context of polar coded IR-HARQ, the disclosed embodiments can be applied to IR-HARQ with another encoding scheme.

FIG. 1 illustrates a wireless communication network 100 according to some embodiments of the present disclosure. The network 100 may be a 5G network. The network 100 includes a number of base stations (BSs) 105 (individually labeled as 105a, 105b, 105c, 105d, 105e, and 105f) and other network entities. A BS 105 may be a station that communicates with UEs 115 and may also be referred to as an evolved node B (eNB), a next generation eNB (gNB), an access point, and the like. Each BS 105 may provide communication coverage for a particular geographic area. In 3GPP, the term "cell" can refer to this particular geographic coverage area of a BS 105 and/or a BS subsystem serving the coverage area, depending on the context in which the term is used.

A BS 105 may provide communication coverage for a macro cell or a small cell, such as a pico cell or a femto cell, and/or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A BS for a macro cell may be referred to as a macro BS. A BS for a small cell may be referred to as a small cell BS, a pico BS, a femto BS or a home BS. In the example shown in FIG. 1, the BSs 105d and 105e may be regular macro BSs, while the BSs 105a-105c may be macro BSs enabled with one of three dimension (3D), full dimension (FD), or massive MIMO. The BSs 105a-105c may take advantage of their higher dimension MIMO capabilities to exploit 3D beamforming in both elevation and azimuth beamforming to increase coverage and capacity. The BS 105f may be a small cell BS which may be a home node or portable access point. A BS 105 may support one or multiple (e.g., two, three, four, and the like) cells.

The network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time.

The UEs 115 are dispersed throughout the wireless network 100, and each UE 115 may be stationary or mobile. A UE 115 may also be referred to as a terminal, a mobile station, a subscriber unit, a station, or the like. A UE 115 may be a cellular phone, a personal digital assistant (PDA), a wireless modem, a wireless communication device, a handheld device, a tablet computer, a laptop computer, a cordless phone, a wireless local loop (WLL) station, or the like. In one aspect, a UE 115 may be a device that includes a Universal Integrated Circuit Card (UICC). In another aspect, a UE may be a device that does not include a UICC. In some aspects, the UEs 115 that do not include UICCs may also be referred to as IoT devices or internet of everything (IoE) devices. The UEs 115a-115d are examples of mobile smart phone-type devices accessing network 100. A UE 115 may also be a machine specifically configured for connected communication, including machine type communication (MTC), enhanced MTC (eMTC), narrowband IoT (NB-IoT) and the like. The UEs 115e-115k are examples of various machines configured for communication that access the network 100. A UE 115 may be able to communicate with any type of the BSs, whether macro BS, small cell, or the like. In FIG. 1, a lightning bolt (e.g., communication links) indicates wireless transmissions between a UE 115 and a serving BS 105, which is a BS designated to serve the UE 115 on the downlink and/or uplink, or desired transmission between BSs, and backhaul transmissions between BSs.

In operation, the BSs 105a-105c may serve the UEs 115a and 115b using 3D beamforming and coordinated spatial techniques, such as coordinated multipoint (CoMP) or multi-connectivity. The macro BS 105d may perform backhaul communications with the BSs 105a-105c, as well as small cell, the BS 105f. The macro BS 105d may also transmits multicast services which are subscribed to and received by the UEs 115c and 115d. Such multicast services may include mobile television or stream video, or may include other services for providing community information, such as weather emergencies or alerts, such as Amber alerts or gray alerts.

The BSs 105 may also communicate with a core network. The core network may provide user authentication, access authorization, tracking, Internet Protocol (IP) connectivity, and other access, routing, or mobility functions. At least some of the BSs 105 (e.g., which may be an example of an evolved NodeB (eNB) or an access node controller (ANC)) may interface with the core network through backhaul links (e.g., S1, S2, etc.) and may perform radio configuration and scheduling for communication with the UEs 115. In various examples, the BSs 105 may communicate, either directly or indirectly (e.g., through core network), with each other over backhaul links (e.g., X1, X2, etc.), which may be wired or wireless communication links.

The network 100 may also support mission critical communications with ultra-reliable and redundant links for mission critical devices, such as the UE 115e, which may be a drone. Redundant communication links with the UE 115e may include links from the macro BSs 105d and 105e, as well as links from the small cell BS 105f. Other machine type devices, such as the UE 115f (e.g., a thermometer), the UE 115g (e.g., smart meter), and UE 115h (e.g., wearable device) may communicate through the network 100 either directly with BSs, such as the small cell BS 105f, and the macro BS 105e, or in multi-hop configurations by communicating with another user device which relays its information to the network, such as the UE 115f communicating temperature measurement information to the smart meter, the UE 115g, which is then reported to the network through the small cell BS 105f. The network 100 may also provide additional network efficiency through dynamic, low-latency TDD/FDD communications, such as in a vehicle-to-vehicle (V2V)

In some implementations, the network 100 utilizes OFDM-based waveforms for communications. An OFDM-based system may partition the system BW into multiple (K) orthogonal subcarriers, which are also commonly referred to as subcarriers, tones, bins, or the like. Each subcarrier may be modulated with data. In some instances, the subcarrier spacing between adjacent subcarriers may be fixed, and the total number of subcarriers (K) may be dependent on the system BW. The system BW may also be partitioned into subbands. In other instances, the subcarrier spacing and/or the duration of TTIs may be scalable.

In an embodiment, the BSs 105 can assign or schedule transmission resources (e.g., in the form of time-frequency resource blocks (RB)) for downlink (DL) and uplink (UL) transmissions in the network 100. DL refers to the transmission direction from a BS 105 to a UE 115, whereas UL refers to the transmission direction from a UE 115 to a BS 105. The communication can be in the form of radio frames. A radio frame may be divided into a plurality of subframes, for example, about 10. Each subframe can be divided into slots, for example, about 2. Each slot may be further divided into mini-slots. In a frequency-division duplexing (FDD) mode, simultaneous UL and DL transmissions may occur in different frequency bands. For example, each subframe includes a UL subframe in a UL frequency band and a DL subframe in a DL frequency band. In a time-division duplexing (TDD) mode, UL and DL transmissions occur at different time periods using the same frequency band. For example, a subset of the subframes (e.g., DL subframes) in a radio frame may be used for DL transmissions and another subset of the subframes (e.g., UL subframes) in the radio frame may be used for UL transmissions.

The DL subframes and the UL subframes can be further divided into several regions. For example, each DL or UL subframe may have pre-defined regions for transmissions of reference signals, control information, and data. Reference signals are predetermined signals that facilitate the communications between the BSs 105 and the UEs 115. For example, a reference signal can have a particular pilot pattern or structure, where pilot tones may span across an operational BW or frequency band, each positioned at a pre-defined time and a pre-defined frequency. For example, a BS 105 may transmit cell specific reference signals (CRSs) and/or channel state information-reference signals (CSI-RSs) to enable a UE 115 to estimate a DL channel. Similarly, a UE 115 may transmit sounding reference signals (SRSs) to enable a BS 105 to estimate a UL channel Control information may include resource assignments and protocol controls. Data may include protocol data and/or operational data. In some embodiments, the BSs 105 and the UEs 115 may communicate using self-contained subframes. A self-contained subframe may include a portion for DL communication and a portion for UL communication. A self-contained subframe can be DL-centric or UL-centric. A DL-centric subframe may include a longer duration for DL communication than for UL communication. A UL-centric subframe may include a longer duration for UL communication than for UL communication.

In an embodiment, the network 100 may be an NR network deployed over a licensed spectrum. The BSs 105 can transmit synchronization signals (e.g., including a primary synchronization signal (PSS) and a secondary synchronization signal (SSS)) in the network 100 to facilitate synchronization. The BSs 105 can broadcast system information associated with the network 100 (e.g., including a master information block (MIB), remaining minimum system information (RMSI), and other system information (OSI)) to facilitate initial network access. In some instances, the BSs 105 may broadcast the PSS, the SSS, and/or the MIB in the form of synchronization signal blocks (SSBs) over a physical broadcast channel (PBCH) and may broadcast the RMSI and/or the OSI over a physical downlink shared channel (PDSCH).

In an embodiment, a UE 115 attempting to access the network 100 may perform an initial cell search by detecting a PSS from a BS 105. The PSS may enable synchronization of period timing and may indicate a physical layer identity value. The UE 115 may then receive a SSS. The SSS may enable radio frame synchronization, and may provide a cell identity value, which may be combined with the physical layer identity value to identify the cell. The SSS may also enable detection of a duplexing mode and a cyclic prefix length. The PSS and the SSS may be located in a central portion of a carrier or any suitable frequencies within the carrier.

After receiving the PSS and SSS, the UE 115 may receive a MIB. The MIB may include system information for initial network access and scheduling information for RMSI and/or OSI. After decoding the MIB, the UE 115 may receive RMSI and/or OSI. The RMSI and/or OSI may include radio resource control (RRC) information related to random access channel (RACH) procedures, paging, control resource set (CORESET) for physical downlink control channel (PDCCH) monitoring, physical uplink control channel (PUCCH), physical uplink shared channel (PUSCH), power control, SRS, and cell barring.

After obtaining the MIB, the RMSI and/or the OSI, the UE 115 can perform a random access procedure to establish a connection with the BS 105. For the random access procedure, the UE 115 may transmit a random access preamble and the BS 105 may respond with a random access response. Upon receiving the random access response, the UE 115 may transmit a connection request to the BS 105 and the BS 105 may respond with a connection response (e.g., contention resolution message).

After establishing a connection, the UE 115 and the BS 105 can enter a normal operation stage, where operational data may be exchanged. For example, the BS 105 may schedule the UE 115 for UL and/or DL communications. The BS 105 may transmit UL and/or DL scheduling grants to the UE 115 via a PDCCH. The BS 105 may transmit a DL communication signal to the UE 115 via a PDSCH according to a DL scheduling grant. The UE 115 may transmit a UL communication signal to the BS 105 via a PUSCH and/or PUCCH according to a UL scheduling grant.

In an embodiment, the BS 105 may communicate with a UE 115 using a polar coded IR-HARQ scheme to improve communication reliability. For example, the BS 105 may receive a DL data packet (e.g., including information bits) from a higher layer (e.g., a media access control (MAC) layer) in the form of a transport block (TB). The BS 105 may apply IR-HARQ to transmit the TB to the UE 115 over multiple transmissions. The BS 105 may encode the TB using a certain coding scheme such as a polar code. The BS 105 may transmit the encoded TB (e.g., including coded bits) in an initial transmission. The BS 105 may selectively repeat a subset of the information bits in a subsequent transmission. For example, the BS 105 may relocate the bits with the lowest transmission reliability (e.g., a reliability rate of about 10%) in the initial transmission to resource locations having the highest transmission reliability (e.g., a reliability rate of about 99%) in the subsequent transmission. Similarly, the UE 115 may employ similar polar coded IR-HARQ mechanisms for UL communications with the BS 105. In some examples, the BS 105 and/or the UE 115 may employ mechanisms for bit relocation in IR-HARQ retransmissions described in PCT Patent Application No. PCT/CN2018/075950, filed Feb. 9, 2018, which is hereby incorporated by reference in its entirety as if fully set forth herein and for all applicable purposes. Further, according to the embodiments of the present disclosure, the BS 105 and/or the UE 115 may determine a code rate for the subsequent transmission by considering channel capacity information associated with the initial transmission and the subsequent transmission and may determine a number of bits to repeat in the subsequent transmission based on the determined code rate. Mechanisms for determining code rates and/or number of bits to repeat in IR-HARQ retransmissions are described in greater detail herein.

Figure 2:
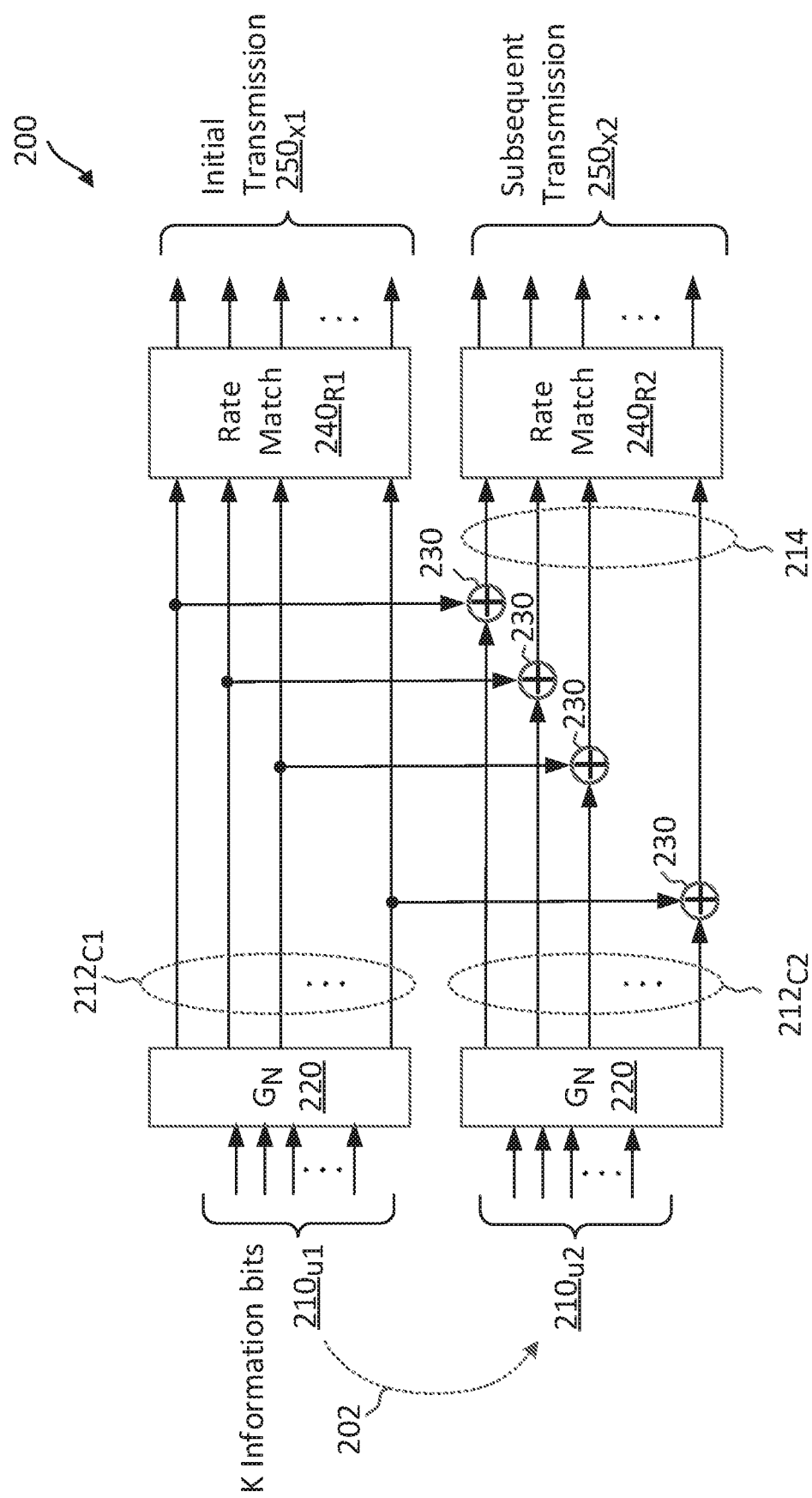
FIG. 2 illustrates a polar coded incremental redundancy hybrid automatic repeat request (IR-HARQ) method according to some embodiments of the present disclosure.

FIG. 2 illustrates a polar coded IR-HARQ method 200 according to some embodiments of the present disclosure. The method 200 may be employed by BSs such as the BSs 105 and UEs such as the UEs 115 in a network such as the network 100. In particular, a BS or a UE may implement the method 200 for DL transmissions or UL transmission, respectively. In the method 200, a transmitting node (e.g., a BS or a UE) receives a block of K plurality of information bits $210_{u1}$ from a higher layer such as a MAC layer, for example, in the form of a TB, where K is a positive integer. The transmitting node may encode and transmit the information bits $210_{u1}$ in an initial transmission and selectively repeat and re-encode a portion of the information bits $210_{u1}$ in a subsequent transmission.

For the initial transmission, the transmitting node applies a polar encoding channel transformation matrix 220, denoted as $G_N$, to the information bits $210_{u1}$ to generate a codeword including N number of coded bits $212_{C1}$, where N is a positive integer greater than K. After the encoding, the transmitting node applies rate matching $240_{R1}$ to rate match the coded bits $212_{C1}$ to $N_1$ plurality of output bits $250_{x1}$, where $N_1$ is a positive integer. The rate matching $240_{R1}$ process adjusts the length of the codeword (the N code bits $212_{C1}$) into a corresponding desired output codeword length (the $N_1$ output bits 2500. The rate matching $240_{R1}$ process can include bit collection, interleaving, puncturing, and/or bit selection. After the rate matching $240_{R1}$, the transmitting node transmits the block of output bits $250_{x1}$ to a receiver. The transmitting node may convert the output bits $250_{x1}$ into modulation symbols using a certain modulation scheme (e.g., quadrature phase-shift keying (QPSK), 16-quadrature amplitude modulation (QAM), 256-QAM, 1024-QAM, or 64-QAM) and map the modulation symbols to resources (e.g., time-frequency resource elements (REs)) for the transmission.

For a subsequent transmission, the transmitting node selectively repeat a subset of the information bits $210_{u1}$ as shown by the arrow 202. The selected information bits for the retransmission are shown as $210_{u2}$. The transmitting node may select information bits that are carried by resource locations having the lowest transmission reliability in the initial transmission. The transmitting node may relocate the repeated information bits $210_{u2}$ to resource locations having the highest transmission reliability in the subsequent transmission. The transmitting node applies a polar encoding channel transformation matrix 220 to the relocated information bits $210_{u2}$. Similar to the initial transmission, the polar encoding generates a codeword with N number of coded bits $212_{C2}$. After the encoding, the transmitting node computes a logical bitwise exclusive-or (XOR) 230 between the coded bits $212_{C1}$ and the coded bits $212_{C2}$ to generate N plurality of coded bits 214.

After the bitwise XOR 230 operations, the transmitting node applies rate matching $240_{R2}$ to rate match the N coded bits 214 to $N_2$ plurality of output bits $250_{x2}$, where $N_2$ is a positive integer. $N_1$ and $N_2$ may be determined independently. In some instances, $N_1$ and $N_2$ may have the same value. In some other instances, $N_1$ and $N_2$ may have different values. The transmitting node transmits the block of output bits $250_{x2}$ to the receiver. Similar to the initial transmission, the transmitting node may convert the output bits $250_{x2}$ into modulation symbols using a certain modulation scheme, which may be different or the same as the modulation scheme in the initial transmission, and may map the modulation symbols to resources for the transmission.

Figure 3:
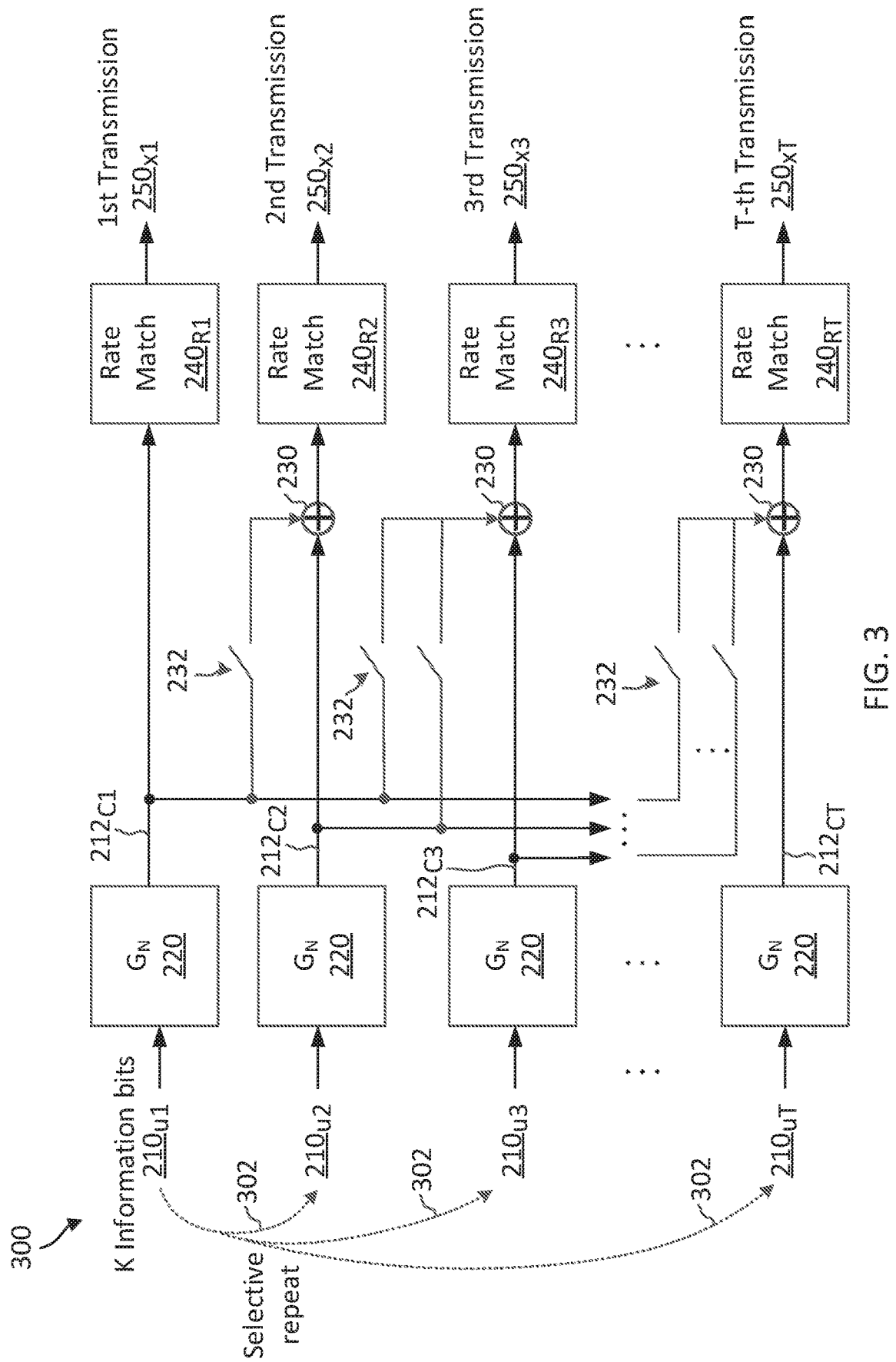
FIG. 3 illustrates a polar coded IR-HARQ method according to some embodiments of the present disclosure.

FIG. 3 illustrates a polar coded IR-HARQ method 300 according to some embodiments of the present disclosure. The method 300 may be employed by BSs such as the BSs 105 and UEs such as the UEs 115 in a network such as the network 100. In particular, a BS or a UE may implement the method 300 for DL transmissions or UL transmissions, respectively. The method 300 is similar to the method 200, but extends the number of transmissions for each data packet or TB from two transmissions to T number of transmissions, where T may be any suitable value. For example, T may be about 3, 4, 5, 6 or more.

Similar to the method 200, for an initial transmission (a first transmission), a transmitting node applies a polar encoding channel transformation matrix 220, $G_N$, to K information bits $210_{u1}$ to generate N plurality of coded bits $212_{C1}$ and applies rate matching $240_{R1}$ to rate match the N coded bits $212_{C1}$ to $N_1$ plurality of output bits $250_{x1}$. The transmitting node selects a subset of the K information bits $210_{u1}$ to be repeated for each subsequent transmission as shown by the arrows 302. The selection may be based on the bit transmission reliability in a previous transmission.

For each subsequent $i^{th}$ transmission, the transmitting node performs similar operations as in the method 200. For example, the transmitting node selects a subset of the information bits $210_{u1}$ to repeat in the $i^{th}$ transmission and applies a polar encoding channel transformation matrix 220 to the corresponding subset of information bits $210_{u1}$ (shown as $210_{u2}, 210_{u3}, \ldots, 210_{uT}$) to generate N coded bits $212_{Ci}$ (shown as $212_{C2}, 212_{C3}, \ldots, 212_{CT}$) and computes a logical bitwise XOR 230 operation among the coded bits 212 (e.g., the coded bits $212_{C1}$ to $212_{Ci-1}$) from previous transmissions and the coded bits $212_{Ci}$ for the corresponding $i^{th}$ transmission. The transmitting node applies a rate matching $240_{Ri}$ after the logical bitwise XOR 230 operations to produce an output codeword including output bits $250_{xi}$ (shown as $250_{x2}, 250_{x3}, \ldots, 250_{xT}$). The output codeword length or the number of output bits $250_{xi}$ for each $i^{th}$ transmission may be the same or different. In an embodiment, the bitwise XOR 230 operations may be selectively enabled or disabled via the switches 232.

The receiver may collect log-likelihood ratios (LLRs) from the multiple transmissions and combine the LLRs from the multiple transmission to recover the original information bits. In an embodiment, the receiver may perform the decoding process in a sequential order from the $T^{th}$ transmission to the first transmission. The incremental repeating of portions of the information bits $210_{u1}$ can improve transmission reliability. However, different transmissions may use different output codeword lengths (e.g., different $N_1$ and $N_2$) and/or different modulation schemes and may have different SNRs. Thus, the determination or selection of which bits to repeat and/or how many bits to repeat in each subsequent transmission can be challenging.

One approach to determining an optimal number of bits to repeat for a subsequent $i^{th}$ transmission is to apply a density evolution (DE) algorithm. However, the DE algorithm is complex and computationally intensive. Thus, the DE algorithm may not be suitable or practical for run-time implementations.

Accordingly, the present disclosure provides techniques to determine an optimal number of bits to repeat for each $i^{th}$ subsequent transmission based on parametrization and/or prediction network (e.g., a neural network) instead of using DE as described in greater detail herein.

Figure 4:
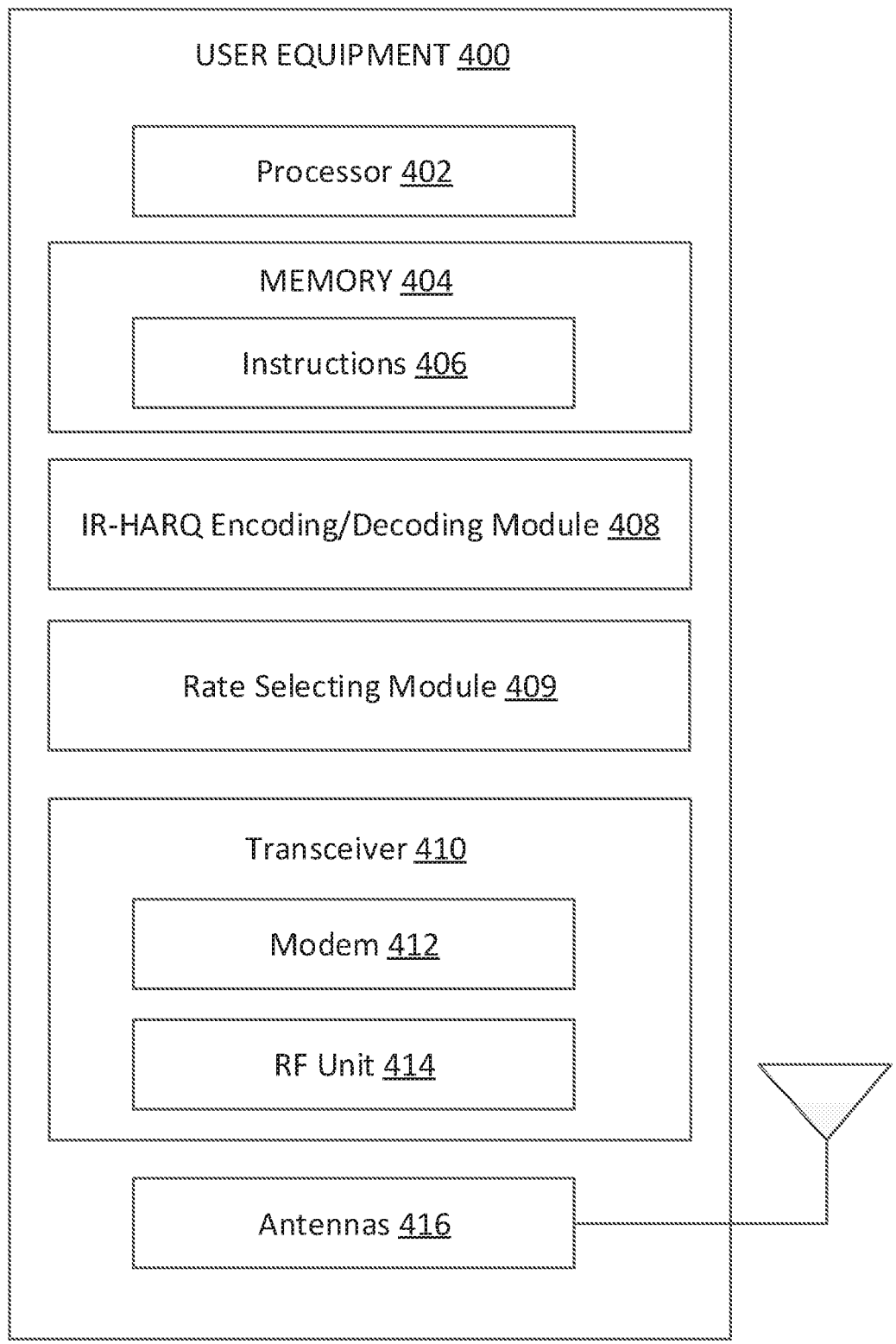
FIG. 4 is a block diagram of a user equipment (UE) according to some embodiments of the present disclosure.

FIG. 4 is a block diagram of an exemplary UE 400 according to embodiments of the present disclosure. The UE 400 may be a UE 115 in the network 100 as discussed above. As shown, the UE 400 may include a processor 402, a memory 404, an IR-HARQ encoding/decoding module 408, a rate splitting module 409, a transceiver 410 including a modem subsystem 412 and a radio frequency (RF) unit 414, and one or more antennas 416. These elements may be in direct or indirect communication with each other, for example via one or more buses.

The processor 402 may include a central processing unit (CPU), a digital signal processor (DSP), an application specific integrated circuit (ASIC), a controller, a field programmable gate array (FPGA) device, another hardware device, a firmware device, or any combination thereof configured to perform the operations described herein. The processor 402 may also be implemented as a combination of computing devices, e.g., a combination of a DSP and a microprocessor, a plurality of microprocessors, one or more microprocessors in conjunction with a DSP core, or any other such configuration.

The memory 404 may include a cache memory (e.g., a cache memory of the processor 402), random access memory (RAM), magnetoresistive RAM (MRAM), read-only memory (ROM), programmable read-only memory (PROM), erasable programmable read only memory (EPROM), electrically erasable programmable read only memory (EEPROM), flash memory, solid state memory device, hard disk drives, other forms of volatile and non-volatile memory, or a combination of different types of memory. In an embodiment, the memory 404 includes a non-transitory computer-readable medium. The memory 404 may store instructions 406. The instructions 406 may include instructions that, when executed by the processor 402, cause the processor 402 to perform the operations described herein with reference to the UEs 115 in connection with embodiments of the present disclosure, for example, aspects of FIGS. 6-9. Instructions 406 may also be referred to as code. The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may include a single computer-readable statement or many computer-readable statements.

Each of the IR-HARQ encoding/decoding module 408 and the rate splitting module 409 may be implemented via hardware, software, or combinations thereof. For example, each of the IR-HARQ encoding/decoding module 408 and the rate splitting module 409 may be implemented as a processor, circuit, and/or instructions 406 stored in the memory 404 and executed by the processor 402. In some examples, the IR-HARQ encoding/decoding module 408 and/or the rate splitting module 409 can be integrated within the modem subsystem 412. For example, the IR-HARQ encoding/decoding module 408 and/or the rate splitting module 409 can be implemented by a combination of software components (e.g., executed by a DSP or a general processor) and hardware components (e.g., logic gates and circuitry) within the modem subsystem 412. In some examples, a UE may include one of the IR-HARQ encoding/decoding module 408 or the rate splitting module 409. In other examples, a UE may include both the IR-HARQ encoding/decoding module 408 and the rate splitting module 409.

The IR-HARQ encoding/decoding module 408 and the rate splitting module 409 may be used for various aspects of the present disclosure, for example, aspects of FIGS. 2-3 and 6-9. The IR-HARQ encoding/decoding module 408 is configured to receive a block of UL information bits (e.g., the information bits $210_{u1}$) from a higher layer (e.g., a MAC layer of the UE 400), encode the information bits (e.g., using a polar encoding channel transformation matrix 220), and perform rate match (e.g., the rate match 240) for an initial UL transmission of the information bits to a BS (e.g., the BSs 105). The IR-HARQ encoding/decoding module 408 is further configured to select a number of the information bits based on coordination with the rate splitting module 409, relocate the selected bits to high-reliability transmission locations, re-encode the relocated bits, perform bitwise XOR operations (e.g., the bitwise XOR 230 operations), and rate match (e.g., the rate match 240) for a subsequent UL retransmission to the BS. The retransmission can be based on a NACK feedback received from the BS.

The IR-HARQ encoding/decoding module 408 is further configured to receive DL transmission signals generated based on polar coded IR-HARQ from the BS, computes LLRs from the received DL transmission signals, collect LLRs from multiple received DL transmission signals associated with the same data packet or block of information bits, combine LLRs from the multiple received DL transmission signals based on coordination with the rate splitting module 409 and bit relocation performed by the BS, and recover the original information bits transmitted by the BS from the combined LLRs.

The rate splitting module 409 is configured to receive IR-HARQ configuration information from the BS, determine a code rate for a subsequent retransmission or an upcoming subsequent reception based on the IR-HARQ configuration information, and determine a number of bits to repeat in the retransmission or a number of bits expected to be repeated in the subsequent reception based on the determined code rate. The rate splitting module 409 can apply a prediction network such as a neural network or a deep learning network to determine the code rate and/or the number of bits to repeat for a subsequent retransmission or a subsequent reception. The IR-HARQ configuration information can include a total length (e.g., a TB length) of a block of information bits from the higher layer, a maximum supported TB length, an output code length for an initial transmission, an output code length for each subsequent retransmission, and/or capacity information (e.g., modulation orders, channel conditions, SNRs, interference profiles, and/or noise profiles). Mechanisms for performing polar coded IR-HARQ with rate splitting are described in greater detail herein.

As shown, the transceiver 410 may include the modem subsystem 412 and the RF unit 414. The transceiver 410 can be configured to communicate bi-directionally with other devices, such as the BSs 105. The modem subsystem 412 may be configured to modulate and/or encode the data from the memory 404 and the IR-HARQ encoding/decoding module 408 according to a modulation and coding scheme (MCS), e.g., a low-density parity check (LDPC) coding scheme, a turbo coding scheme, a polar coding scheme, a convolutional coding scheme, a digital beamforming scheme, etc. The RF unit 414 may be configured to process (e.g., perform analog to digital conversion or digital to analog conversion, etc.) modulated/encoded data from the modem subsystem 412 (on outbound transmissions) or of transmissions originating from another source such as a UE 115 or a BS 105. The RF unit 414 may be further configured to perform analog beamforming in conjunction with the digital beamforming. Although shown as integrated together in transceiver 410, the modem subsystem 412 and the RF unit 414 may be separate devices that are coupled together at the UE 115 to enable the UE 115 to communicate with other devices.

The RF unit 414 may provide the modulated and/or processed data, e.g. data packets (or, more generally, data messages that may contain one or more data packets and other information), to the antennas 416 for transmission to one or more other devices. The antennas 416 may further receive data messages transmitted from other devices. The antennas 416 may provide the received data messages for processing and/or demodulation at the transceiver 410. The antennas 416 may include multiple antennas of similar or different designs in order to sustain multiple transmission links. The RF unit 414 may configure the antennas 416.

In an embodiment, the UE 400 can include multiple transceivers 410 implementing different RATs (e.g., NR and LTE). In an embodiment, the UE 400 can include a single transceiver 410 implementing multiple RATs (e.g., NR and LTE). In an embodiment, the transceiver 410 can include various components, where different combinations of components can implement RATs.

Figure 5:
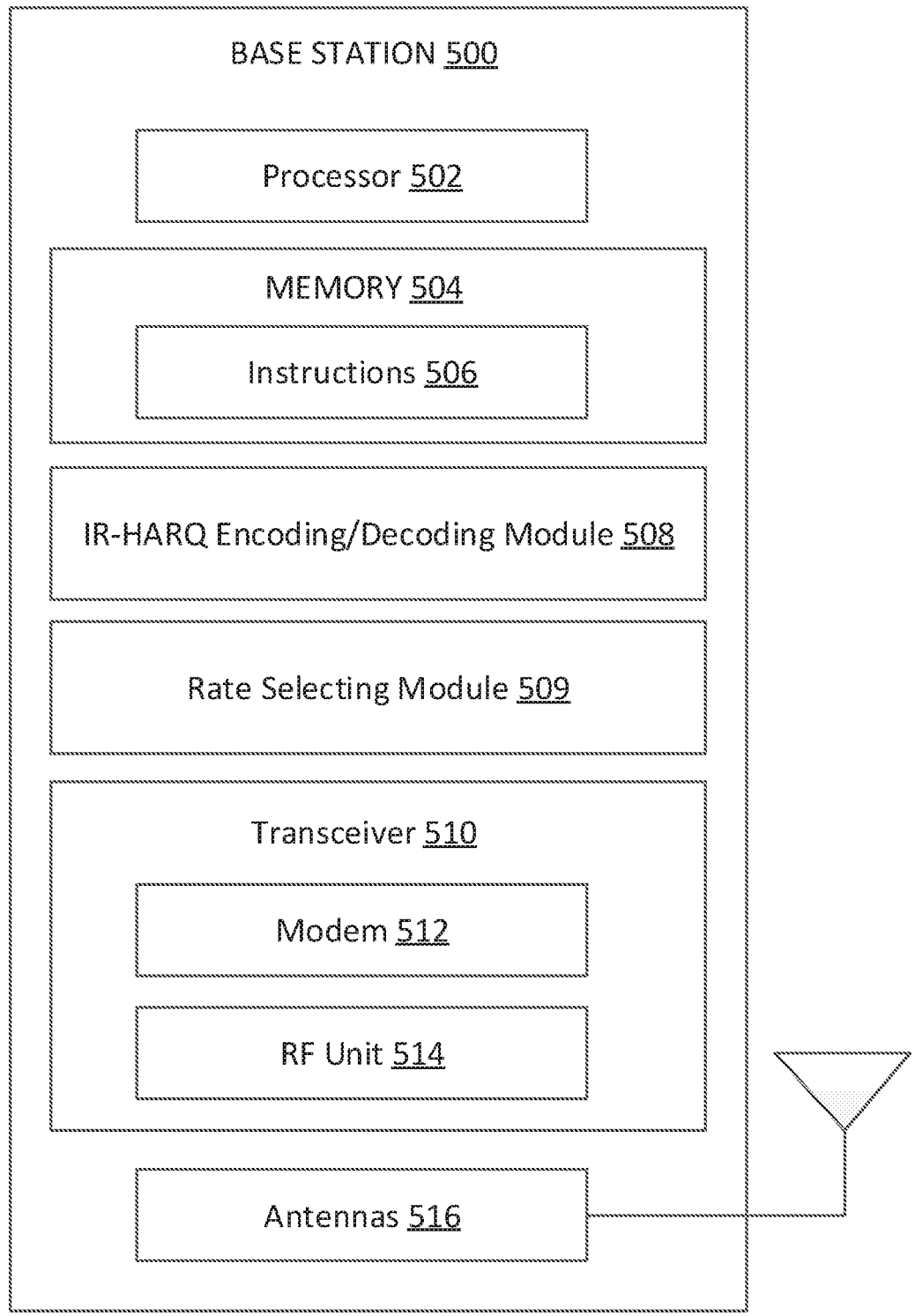
FIG. 5 is a block diagram of an exemplary base station (BS) according to some embodiments of the present disclosure.

FIG. 5 is a block diagram of an exemplary BS 500 according to embodiments of the present disclosure. The BS 500 may be a BS 105 in the network 100 as discussed above. A shown, the BS 500 may include a processor 502, a memory 504, an IR-HARQ encoding/decoding module 508, a rate splitting module 509, a transceiver 510 including a modem subsystem 512 and a RF unit 514, and one or more antennas 516. These elements may be in direct or indirect communication with each other, for example via one or more buses.

The processor 502 may have various features as a specific-type processor. For example, these may include a CPU, a DSP, an ASIC, a controller, a FPGA device, another hardware device, a firmware device, or any combination thereof configured to perform the operations described herein. The processor 502 may also be implemented as a combination of computing devices, e.g., a combination of a DSP and a microprocessor, a plurality of microprocessors, one or more microprocessors in conjunction with a DSP core, or any other such configuration.

The memory 504 may include a cache memory (e.g., a cache memory of the processor 502), RAM, MRAM, ROM, PROM, EPROM, EEPROM, flash memory, a solid state memory device, one or more hard disk drives, memristor-based arrays, other forms of volatile and non-volatile memory, or a combination of different types of memory. In some embodiments, the memory 504 may include a non-transitory computer-readable medium. The memory 504 may store instructions 506. The instructions 506 may include instructions that, when executed by the processor 502, cause the processor 502 to perform operations described herein, for example, aspects of FIG. 6-11. Instructions 506 may also be referred to as code, which may be interpreted broadly to include any type of computer-readable statement(s) as discussed above with respect to FIG. 4.

Each of the IR-HARQ encoding/decoding module 508 and the rate splitting module 409 may be implemented via hardware, software, or combinations thereof. For example, each of the IR-HARQ encoding/decoding module 408 and the rate splitting module 509 may be implemented as a processor, circuit, and/or instructions 506 stored in the memory 504 and executed by the processor 502. In some examples, the IR-HARQ encoding/decoding module 508 and/or the rate splitting module 509 can be integrated within the modem subsystem 512. For example, the IR-HARQ encoding/decoding module 508 and/or the rate splitting module 509 can be implemented by a combination of software components (e.g., executed by a DSP or a general processor) and hardware components (e.g., logic gates and circuitry) within the modem subsystem 512. In some examples, a UE may include one of the IR-HARQ encoding/decoding module 508 or the rate splitting module 509. In other examples, a UE may include both the IR-HARQ encoding/decoding module 508 and the rate splitting module 509.

The IR-HARQ encoding/decoding module 508 and the rate splitting module 509 may be used for various aspects of the present disclosure, for example, aspects of FIGS. 2-3 and 6-9. The IR-HARQ encoding/decoding module 508 is configured to receive a block of DL information bits (e.g., the information bits $210_{u1}$) from a higher layer (e.g., a MAC layer of the BS 500), encode the information bits (e.g., using a polar encoding channel transformation matrix 220), and perform rate match (e.g., the rate match 240) for an initial DL transmission of the information bits to a UE (e.g., the UEs 115 and 400). The IR-HARQ encoding/decoding module 508 is further configured to select a number of the information bits based on coordination with the rate splitting module 509, relocate the selected bits to high-reliability transmission locations, re-encode the relocated bits, perform bitwise XOR operations (e.g., the bitwise XOR 230 operations), and rate match (e.g., the rate match 240) for a subsequent DL retransmission to the BS. The retransmission can be based on a NACK feedback received from the UE.

The IR-HARQ encoding/decoding module 508 is further configured to receive DL transmission signals generated based on polar coded IR-HARQ from the BS, computes LLRs from the received DL transmission signals, collect LLRs from multiple received DL transmission signals associated with the same data packet or block of information bits, combine LLRs from the multiple received DL transmission signals based on coordination with the rate splitting module 509 and bit relocation performed by the UE, and recover the original information bits transmitted by the UE from the combined LLRs.

The rate splitting module 509 is configured to transmit IR-HARQ configuration information to the UE, determine a code rate for a subsequent retransmission or an upcoming subsequent reception based on the IR-HARQ configuration information, and determine a number of bits to repeat in the retransmission or a number of bits expected to be repeated in the subsequent reception based on the determined code rate. The rate splitting module 509 can apply a prediction network such as a neural network or a deep learning network to determine the code rate and/or the number of bits to repeat for a subsequent retransmission or a subsequent reception. The IR-HARQ configuration information can include a total length (e.g., a TB length) of a block of information bits from the higher layer, a maximum supported TB length, an output code length for an initial transmission, an output code length for each subsequent retransmission, and/or capacity information (e.g., modulation orders, channel conditions, SNRs, interference profiles, and/or noise profiles). Mechanisms for performing polar coded IR-HARQ with rate splitting are described in greater detail herein.

As shown, the transceiver 510 may include the modem subsystem 512 and the RF unit 514. The transceiver 510 can be configured to communicate bi-directionally with other devices, such as the UEs 115 and/or another core network element. The modem subsystem 512 may be configured to modulate and/or encode data according to a MCS, e.g., a LDPC coding scheme, a turbo coding scheme, a polar coding scheme, a convolutional coding scheme, a digital beamforming scheme, etc. The RF unit 514 may be configured to process (e.g., perform analog to digital conversion or digital to analog conversion, etc.) modulated/encoded data from the modem subsystem 512 (on outbound transmissions) or of transmissions originating from another source such as a UE 115 or 400. The RF unit 514 may be further configured to perform analog beamforming in conjunction with the digital beamforming. Although shown as integrated together in transceiver 510, the modem subsystem 512 and/or the RF unit 514 may be separate devices that are coupled together at the BS 105 to enable the BS 105 to communicate with other devices.

The RF unit 514 may provide the modulated and/or processed data, e.g. data packets (or, more generally, data messages that may contain one or more data packets and other information), to the antennas 516 for transmission to one or more other devices. This may include, for example, transmission of information to complete attachment to a network and communication with a camped UE 115 or 500 according to embodiments of the present disclosure. The antennas 516 may further receive data messages transmitted from other devices and provide the received data messages for processing and/or demodulation at the transceiver 510. The antennas 516 may include multiple antennas of similar or different designs in order to sustain multiple transmission links.

In an embodiment, the BS 500 can include multiple transceivers 510 implementing different RATs (e.g., NR and LTE). In an embodiment, the BS 500 can include a single transceiver 510 implementing multiple RATs (e.g., NR and LTE). In an embodiment, the transceiver 510 can include various components, where different combinations of components can implement RATs.

Figure 6:
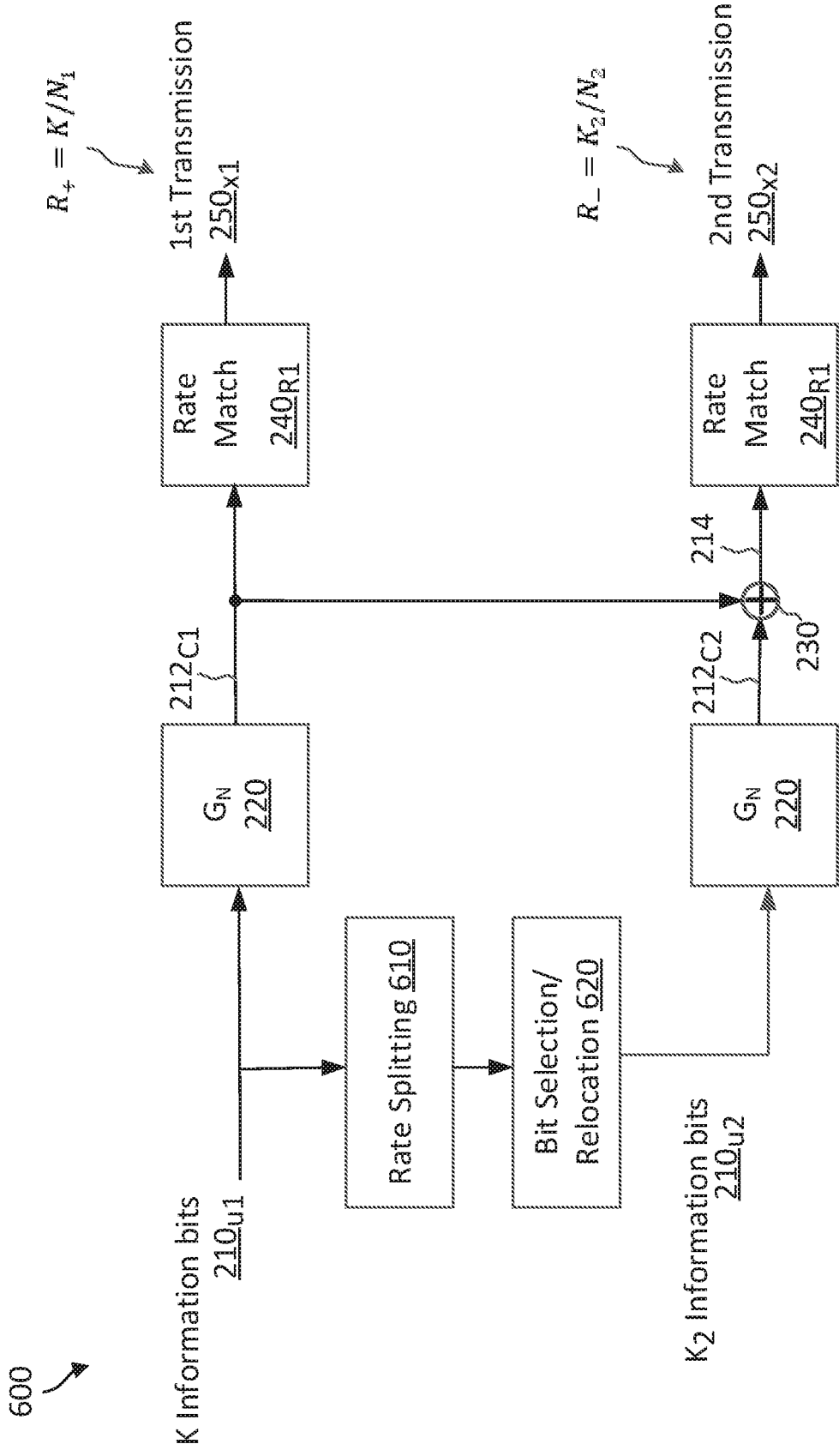
FIG. 6 illustrates a rate-splitting method for polar coded IR-HARQ according to some embodiments of the present disclosure.

FIG. 6 illustrates a rate-splitting method 600 for polar coded IR-HARQ method according to some embodiments of the present disclosure. The method 600 may be employed by BSs such as the BSs 105 and 500 and UEs such as the UEs 115 and 400 in a network such as the network 100. In particular, a BS or a UE may implement the method 300 for DL transmissions or UL transmissions, respectively. The method 600 uses a similar polar coded IR-HARQ transmission architecture as the methods 200 and 300. The method 600 further provides rate-splitting mechanisms for determining an optimal number of bits to repeat in a subsequent transmission. For simplicity of illustration and discussion, FIG. 6 illustrates an initial first transmission carrying all information bits and a subsequent second transmission carrying a subset of the information bits. However, the embodiments of the present disclosure may be scaled to include any suitable number of subsequent retransmissions (e.g., about 3, 4, 5, 6 or more) carrying a portion of information bits from a previous transmission.

Similar to the method 200, for an initial transmission or a first transmission, a transmitting node may encode K number of information bits $210_{u1}$ into N coded information bits $212_{C1}$ via a polar encoding channel transformation matrix 220 and rate match the N coded information bits $212_{C1}$ to $N_1$ number of output bits $250_{x1}$ via a rate matching $240_{R1}$ process. The code rate for the first transmission can be represented as $R_+ = K/N_1$.

The transmitting node performs rate-splitting 610 to determine a number of bits to repeat in a second subsequent transmission. The rate splitting 610 process includes determining a code rate for the second transmission, followed by computing a number of bits to repeat. The code rate determination can be expressed as shown below:

$$R_- = f(K, N_1, N_2, b, K_{max}) \quad (1)$$

where $R_-$ represents the code rate for the second transmission, K represents the total number of information bits (e.g., the information bits $210_{u1}$ in a data packet or TB), $N_1$ represents the output codeword length in the first transmission (e.g., the $N_1$ number of output bits $250_{x1}$), $N_2$ represents the output codeword length in the second transmission (e.g., $N_2$ the number of output bits $250_{x2}$), b represents a bias factor related to bit-channel capacity, and $K_{max}$ represents the maximum allowable number of information bits in a data packet or TB.

In an example, the bias factor b may be determined based on a difference between a modulation scheme used by the first transmission and a modulation scheme to be used by the second transmission. In an example, the bias factor b may be determined based on a difference between an SNR in the first transmission and an estimated or expected SNR for the second transmission. In another example, the bias factor b may be determined based any suitable combination of the modulation scheme used in the first transmission, the modulation scheme to be used in the second transmission, the SNR in the first transmission, an estimated SNR for the second transmission, a noise profile associated with the first transmission, a noise profile associated with the second transmission, an interference profile associated with the first transmission, and an interference profile associated with the second transmission. Some of the channel bit-capacity information associated with the first transmission and the second transmission can be based on short-term and/or long-term channel measurement history.

The output codeword length $N_2$ in the second transmission can be predetermined. For example, the code rate for the second transmission can be represented as $R_- = K_2/N_2$. Thus, after determining the code rate $R_-$, the method 600 may compute an optimal number of bits to repeat for the second transmission as shown below:

$$K_2 = \text{round}(N_2 \times R_-) \quad (2)$$

In some instances, the round function in Equation (2) can be replaced by a ceiling function or a floor function.

After determining the number of bits to repeat for the second transmission, the transmitting node performs bit selection/relocation 620 to select $K_2$ number of bits (shown as $210_{u2}$) from the information bits $210_{u1}$ carried by the least reliable transmission locations in the first transmission and relocate the selected information bits $210_{u2}$ to the most reliable locations of the second transmission. After the bit selection/relocation 620, the transmitting node re-encodes the $K_2$ information bits $210_{u2}$ via a polar encoding channel transformation matrix 220. After the encoding, the transmitting node computes a logical XOR 230 operations between the N coded bits $212_{C1}$ from the first transmission and the coded bits $212_{C2}$ from the second transmission to generate N coded bits 214. The transmitting node rate match the N coded bits 214 to $N_2$ output bits $250_{x2}$ for the second transmission.

In an embodiment, referring to the polar encoding, the first transmission is in an enhanced channel and the second transmission is in a degraded channel due to the XOR 230 operations. The code rate $R_+$ for first transmission is lower than the code rate $R_-$ for the second transmission.

Figure 7:
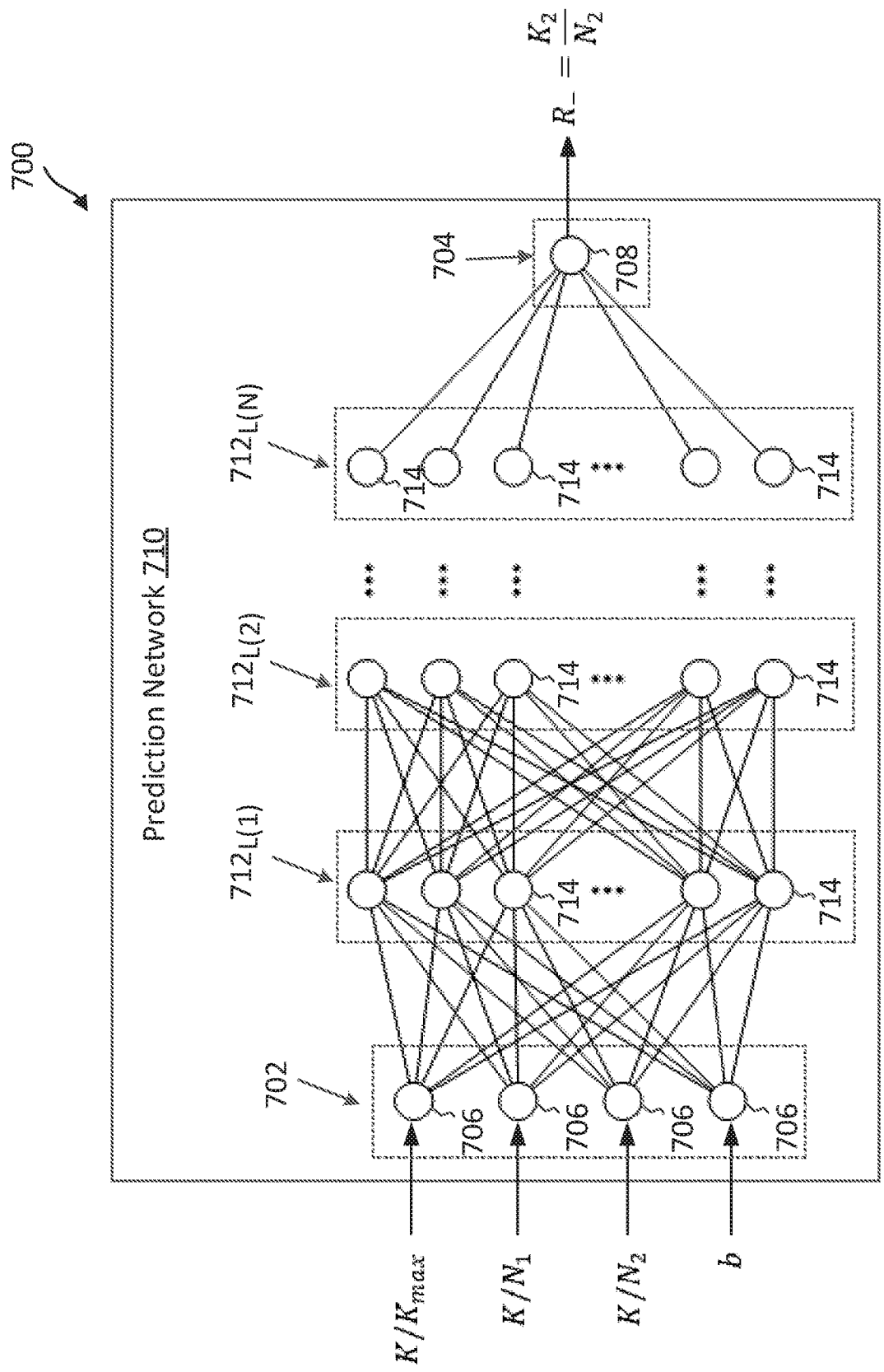
FIG. 7 illustrates a rate-splitting method for polar coded IR-HARQ according to some embodiments of the present disclosure.

FIG. 7 illustrates a rate-splitting method 700 for polar coded IR-HARQ according to some embodiments of the present disclosure. The method 700 may be employed by BSs such as the BSs 105 and 500 and UEs such as the UEs 115 and 400 in a network such as the network 100. The method 700 can be used in conjunction with the method 200, 300, or 600. For example, the rate splitting 610 in method 600 may employ the method 700. The method 700 applies a prediction network model for determining an optimal code rate for a subsequent transmission in IR-HARQ.

The method 700 includes a prediction network 710. In an embodiment, the prediction network 710 is a neural network. In an embodiment, the prediction network 710 is a deep learning network. The prediction network 710 includes M plurality of hidden layers 712 (shown as $712_{L(1)}$, $712_{L(2)}$, ..., $712_{L(M)}$) between an input layer 702 and an output layer 704. The input layer 702 includes a set of nodes 706 corresponding to input parameters $K/K_{max}$, $K/N_1$, $K/N_2$, and b corresponding to parameters described above with respect to equations (1) and (2). The output layer 704 includes an output node 708 corresponding to the optimal code rate $R_-$ in equation (1). Each hidden layer 712 includes a set of nodes 714, which may include various linear functions and/or non-linear functions. The functions can include a set of weights or coefficients. The weights or coefficients in each of the node 714 in each of the hidden layer 712 can be trained such that the prediction network 710 can predict an optimal code rate $R_-$ based on the inputs $K/K_{max}$, $K/N_1$, $K/N_2$, and b.

In an example, the prediction network 710 can be trained by providing multiple sets of input ($K/K_{max}$, $K/N_1$, $K/N_2$, and b) and output ($R_-$). The training can be performed offline. The output in each set can be computed from the inputs in the set using a DE algorithm or any other suitable numerical analysis algorithm to obtain an optimal solution. During training, the prediction network 710 can be applied to the inputs ($K/K_{max}$, $K/N_1$, $K/N_2$, and b) in the set, for example, using a forward propagation process, to obtain a predicted output. The weights or coefficients in the nodes in each of the node 714 in each of the hidden layer 712 can be calibrated or adjusted, for example, via a backpropagation process, to minimize the error between the predicted output and the original output $R_-$ in the set. The forward and backward propagation processes can be repeated multiple times until the output error is sufficiently low.

After the prediction network 710 is trained, the prediction network 710 can be implemented by a BS (e.g., a BS 105 or 500) or a UE (e.g., a UE 115 or 400) and used in run-time as described in greater detail herein.

Figure 8:
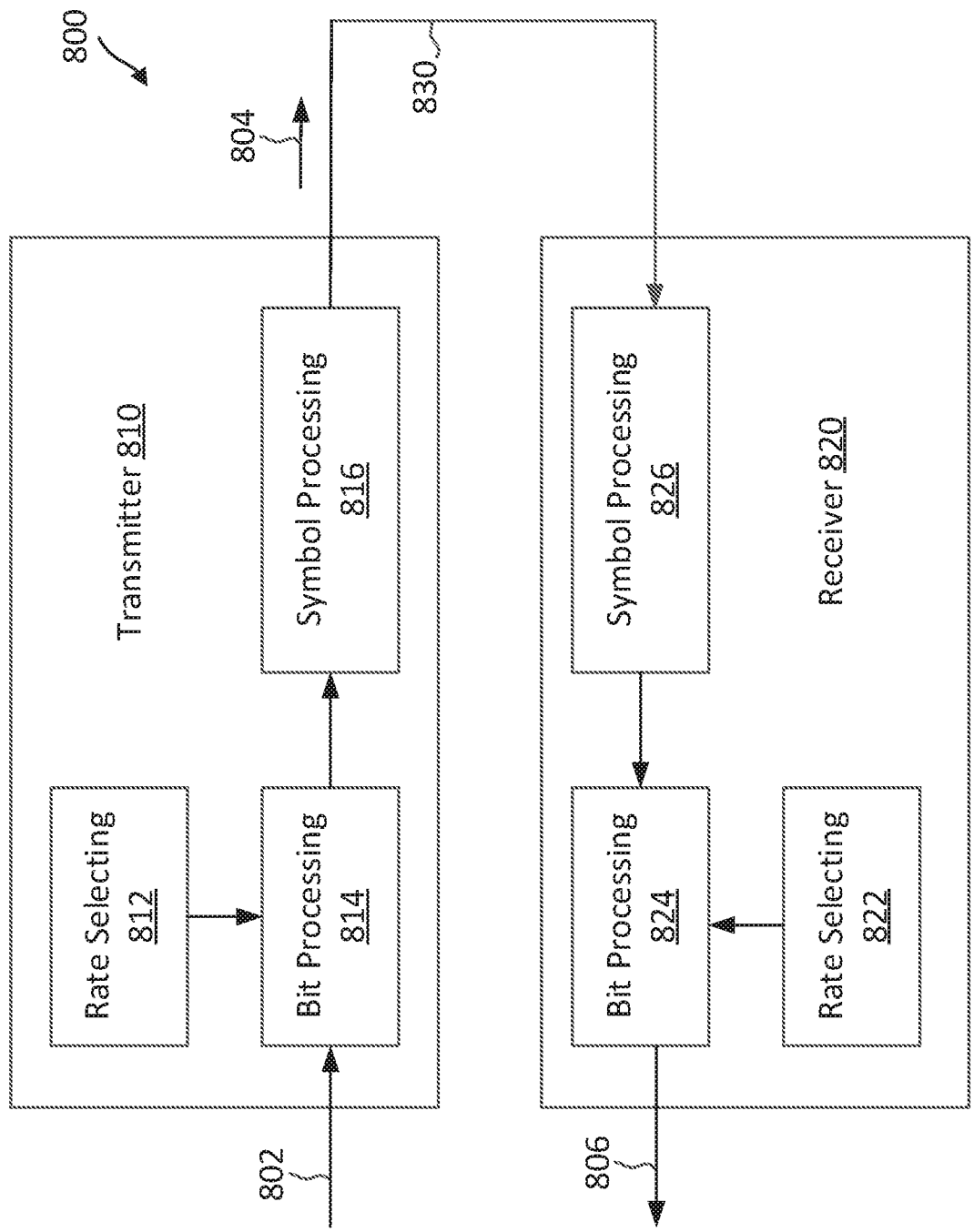
FIG. 8 illustrates a wireless communication system implementing rate-splitting for polar coded IR-HARQ according to some embodiments of the present disclosure.

FIG. 8 illustrates a wireless communication system 800 implementing rate-splitting for polar coded IR-HARQ according to some embodiments of the present disclosure. The system 800 may correspond to a portion of the network 100. The system 800 includes a transmitting node 810 communicatively coupled to a receiving node 820 via a wireless communication link 830. In an example, the transmitting node 810 corresponds to a BS such as the BSs 105 and 500 and the receiving node 820 corresponds to a UE such as the UEs 115 and 400. In another example, the transmitting node 810 corresponds to a UE and the receiving node 820 corresponds to a BS. The transmitting node 810 communicates with the receiving node using IR-HARQ mechanisms as described in the methods 200, 300, and 600. The transmitting node 810 includes a bit processing component 814, a rate splitting component 812, and a symbol processing component 816. The receiving node 820 includes a bit processing component 824, a rate splitting component 822, and a symbol processing component 826.

Prior to a transmission, the transmitting node 810 communicates IR-HARQ configuration information with the receiving node 820. The IR-HARQ configuration information may include parameters such as a maximum allowable number of information bits (e.g., $K_{max}$) for any transmission, a total number of information bits for a certain transmission (e.g., K), an output codeword length for each transmission (e.g., $N_1, N_2, \ldots, N_T$), and a bias factor (e.g., b). For example, a BS may configure the IR-HARQ configuration information semi-statically via an RRC configuration and/or dynamically via a scheduling grant carried in a PDCCH downlink control information (DCI).

In operation, the transmitting node 810 receives a block of information bits 802 (e.g., the information bits $210_{u1}$), for example, from an upper layer such as a MAC layer. The bit processing component 814 is configured to encode the incoming information bits 802 into coded bits (e.g., coded bits $212_{C1}$), for example, using a channel transformation matrix such as the polar encoding channel transformation matrix 220. The bit processing component 814 is further configured to rate match the coded bits based on the output codeword length (e.g., $N_1$ in the IR-HARQ configuration information) for an initial transmission. The symbol processing component 816 is configured to convert the output codeword or output bits to modulation symbols. The symbol processing component 816 is further configured to map the modulation symbols to resources for the transmission. The transmitting node 810 transmits a communication signal 804 carrying the output bits over the link 830.

For a subsequent retransmission, the rate splitting component 812 is configured to determine an optimal number (e.g., $K_2$) of bits to repeat, for example, based on the IR-HARQ configuration information using equations (1) and (2) described with respect to the method 600 and/or the prediction network 710 in the method 700. The bit processing component 814 is further configured to select $K_2$ information bits from the incoming bits 802 that are carried in low-reliability resource locations, relocate the $K_2$ selected information bits to high-reliability resource locations, and re-encode the relocated $K_2$ information bits via a polar encoding (e.g., via the channel transformation matrices 220). The bit processing component 814 is further configured to compute a bitwise XOR (e.g., the bitwise XOR 230 operations) between the coded bits and the re-encoded bits. The bit processing component 814 is further configured to rate match the coded bits after the XOR to an output codeword length (e.g., $N_2$ in the IR-HARQ configuration information). Similar to the initial transmission, the symbol processing component 816 converts the output bits to modulation symbols. The transmitting node 810 transmits another communication signal 804 carrying the output bits. The transmitting node 810 may perform similar encoding, XOR, and rate matching operations for each subsequent retransmission. The number of retransmissions may be dependent on the feedbacks received from the receiving node 820. For example, the transmitting node may repeat, relocate, re-encode, and retransmit a portion of bits (e.g., the less reliable bits) in the information bits 802 from the previous transmission upon receiving a NACK from the receiving node 820.

Upon receiving the communication signal 804 at the receiving node 820, the symbol processing component 826 is configured to perform channel estimation and perform symbol demodulation. The bit decoding component 824 is configured to compute LLRs for each received communication signal 804. The bit decoding component 824 is further configured to collect LLRs computed for each received communication signal 804 associated with the block of information bits 802. The bit decoding component 824 is further configured to combine the LLRs computed from the multiple received communication signals to recover the original transmitted information bits 802 (shown as decoded bits 806). The rate splitting component 822 is substantially similar to the rate splitting component 812. The rate splitting component 822 may determine the number of bits that are expected to be repeated in a subsequent communication signal 804 based on the IR-HARQ information. The bit decoding component 824 may perform rate match based on the number of bits determined by the rate splitting component 822. The bit decoding component 824 may combine the LLRs based on the number of bits determined by the rate splitting component 822 and corresponding bit relocations. In an embodiment, the bit decoding component 824 may perform the decoding from the latest received communication signal 804 to the earliest received communication signal 804 (e.g., from the $T^{th}$ transmission to the first transmission).

Figure 9:
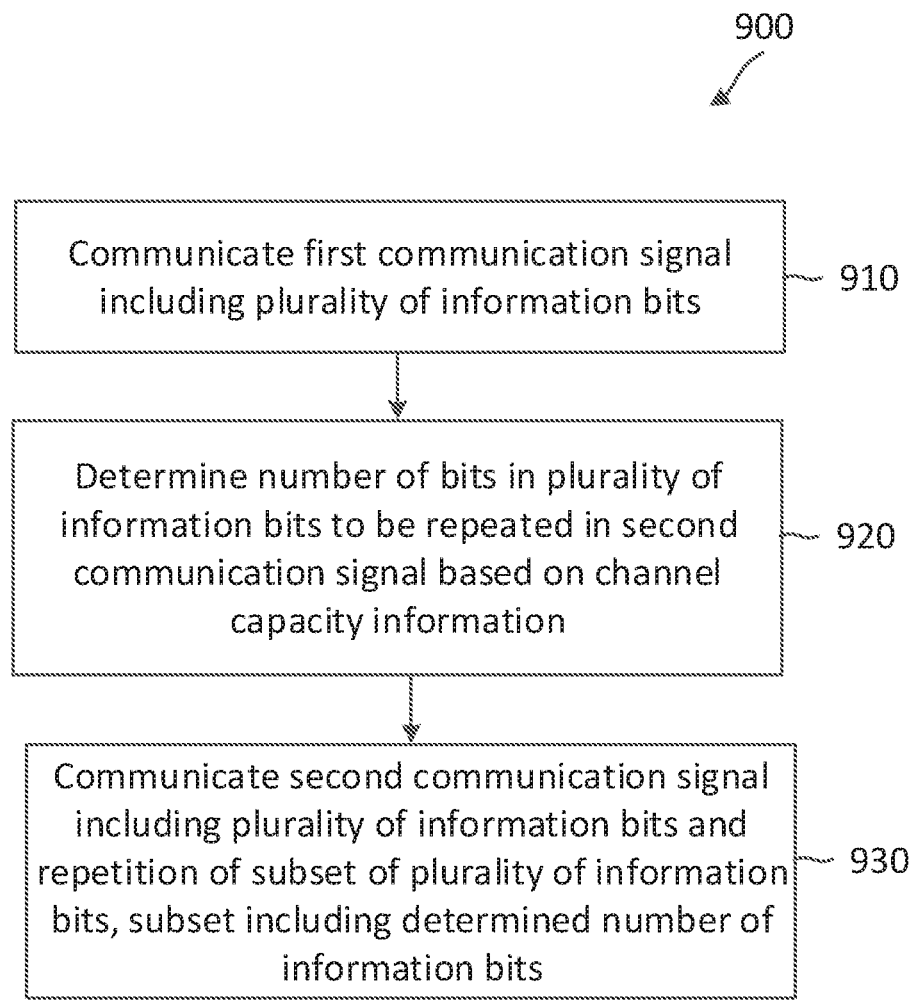
FIG. 9 is a flow diagram of a polar coded IR-HARQ communication method according to some embodiments of the present disclosure.

FIG. 9 is a flow diagram of a polar coded IR-HARQ communication method 900 according to some embodiments of the present disclosure. Steps of the method 900 can be executed by a computing device (e.g., a processor, processing circuit, and/or other suitable component) of a wireless communication device or other suitable means for performing the steps. For example, a wireless communication device, such as the UE 115 or UE 400, may utilize one or more components, such as the processor 402, the memory 404, the IR-HARQ encoding/decoding module 408, the rate splitting module 409, the transceiver 410, the modem 412, and the one or more antennas 416, to execute the steps of method 900. Alternatively, a wireless communication device, such as the BS 105 or BS 500, may utilize one or more components, such as the processor 502, the memory 504, the IR-HARQ encoding/decoding module 508, the rate splitting module 509, the transceiver 510, the modem 512, and the one or more antennas 516, to execute the steps of method 900. Yet alternatively, a wireless communication device, such as the transmitting node 810 may utilize one or more components, such as the rate splitting component 812, the bit processing component 814, and the symbol processing component 816, to execute the steps of method 900. Yet alternatively, a wireless communication device, such as the receiving node 820 may utilize one or more components, such as the rate splitting component 822, the bit processing component 824, and the symbol processing component 826, to execute the steps of method 900. The method 900 may employ similar mechanisms in the methods 200, 300, 600, and 700 as described with respect to FIGS. 2, 3, 6, and 7, respectively, and the system 800 described with respect to FIG. 8. As illustrated, the method 900 includes a number of enumerated steps, but embodiments of the method 900 may include additional steps before, after, and in between the enumerated steps. In some embodiments, one or more of the enumerated steps may be omitted or performed in a different order.

At step 910, the method 900 includes communicating, by a first wireless communication device with a second wireless communication device, a first communication signal (e.g., the communication signal 804) including a plurality of information bits (e.g., the information bits $210_{u1}$).

At step 920, the method 900 includes determining, by the first wireless communication device, a number of bits (e.g., $K_2$) in the plurality of information bits to be repeated in a second communication signal based on channel capacity information.

At step 930, the method 900 includes communicating, by the first wireless communication device with the second wireless communication device, the second communication signal including the plurality of information bits and a repetition of a subset of the plurality of information bits (e.g., the information bits $210_{u2}$). The subset of the plurality of information bits includes the determined number of bits.

In an embodiment, the first wireless communication device corresponds to a transmitter (e.g., the transmitting node 810) and the second wireless communication device corresponds to a receiver (e.g., the receiving node 820). The communicating the first communication signal and the second communication signal include transmitting the first communication signal and the second communication signal from the first wireless communication device to the second wireless communication device.

In an embodiment, the first wireless communication device corresponds to a receiver (e.g., the receiving node 820) and the second wireless communication device corresponds to a transmitter (e.g., the transmitting node 810). The communicating the first communication signal and the second communication signal include receiving the first communication signal and the second communication signal by the first wireless communication device from the second wireless communication device.

In an embodiment, the first wireless communication device determines the number of bits by determining a code rate (e.g., R_) based on the channel capacity information and determining the number of bits based on the code rate.

In an embodiment, the code rate is determined based on at least one of a first modulation order associated with the first communication signal or a second modulation order associated with the second communication signal. In an embodiment, the code rate is determined based on at least one of a first SNR associated with the first communication signal, a second SNR associated with the second communication signal, a first noise parameter associated with first communication signal, or a second noise parameter associated with the second communication signal. In an embodiment, the code rate is determined based on at least one of a first codeword length (e.g., $N_1$) associated with the plurality of information bits in the first communication signal, a second codeword length (e.g., $N_2$) associated with the subset of the plurality of information bits in the second communication signal, or a total number (e.g., K) of the plurality of information bits.

In an embodiment, the code rate is determined by applying a prediction network (e.g., the prediction network 710) to at least one of the first codeword length, the second codeword length, the total number of the plurality of information bits, the channel capacity information, or a maximum allowable number of information bits. The prediction network can be trained by providing a set of training parameters including at least one of a second channel capacity parameter, a first training codeword length associated with a first transmission of a plurality of training information bits, a second training codeword length associated with a retransmission of the plurality of training information bits, a number of the plurality of training information bits, or a maximum allowable number of training information bits and providing a code rate associated with the set of training parameters.

In an embodiment, when the first wireless communication device is a transmitter, the first wireless communication device generates the first communication signal based on the first codeword length and a first encoding of the plurality of information bits and generates the second communication signal based on the second codeword length, the first encoding of the plurality of information bits, and a second encoding of the subset of the plurality of information bits. In an embodiment, the first encoding is based on a first polar code (e.g., the polar encoding channel transformation matrix 220) and the second encoding is based on a second polar code. In an embodiment, the first wireless communication device further generates the first communication signal based on a first rate-match (e.g., the rate match $240_{R1}$) and generates the second communication signal based on a second rate-match (e.g., the rate match $240_{R2}$).

In an embodiment, when the first wireless communication device is a receiver, the first wireless communication device recovers the plurality of information bits by performing a first decoding on the first communication signal based on the first codeword length and performing a second decoding on the second communication signal based on the second codeword length. In an embodiment, the first decoding is based on a first polar code and the second decoding is based on a second polar code. In an embodiment, the first decoding is further based on a first rate-match and the second decoding is further based on a second rate-match.

In an embodiment, the first wireless communication device communicates, with the second wireless communication device, information associated with at least one of the first codeword length, the second codeword length, the total number of the plurality of information bits, the channel capacity information, or a maximum allowable number of information bits.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of [at least one of A, B, or C] means A or B or C or AB or AC or BC or ABC (i.e., A and B and C).

Further embodiments of the present disclosure include a computer-readable medium having program code recorded thereon, the program code comprising code for causing a first wireless communication device to communicate, with a second wireless communication device, a first communication signal including a plurality of information bits; code for causing the first wireless communication device to determine a number of bits in the plurality of information bits to be repeated in a second communication signal based on channel capacity information; and code for causing the first wireless communication device to communicate, with the second wireless communication device, the second communication signal including the plurality of information bits and a repetition of a subset of the plurality of information bits, the subset of the plurality of information bits including the determined number of bits.

In some embodiments, wherein the code for causing the first wireless communication device to determine the number of bits in the plurality of information bits to be repeated in the second communication signal is further configured to determine a code rate based on the channel capacity information; and determine the number of bits based on the code rate. In some embodiments, wherein the code for causing the first wireless communication device to determine the code rate is further configured to determine the code rate based on at least one of a first modulation order associated with the first communication signal, a second modulation order associated with the second communication signal, a first signal-to-noise-ratio (SNR) associated with the first communication signal, a second SNR associated with the second communication signal, a first noise parameter associated with first communication signal, or a second noise parameter associated with the second communication signal. In some embodiments, wherein the code for causing the first wireless communication device to determine the code rate is further configured to determine the code rate based on at least one of a first codeword length associated with the plurality of information bits in the first communication signal, a second codeword length associated with the subset of the plurality of information bits in the second communication signal, or a total number of the plurality of information bits. In some embodiments, wherein the code for causing the first wireless communication device to determine the code rate is further configured to apply a prediction network to at least one of the first codeword length, the second codeword length, the total number of the plurality of information bits, the channel capacity information, or a maximum allowable number of information bits, and wherein the prediction network is trained by providing a set of training parameters including at least one of a second channel capacity parameter, a first training codeword length associated with a first transmission of a plurality of training information bits, a second training codeword length associated with a retransmission of the plurality of training information bits, a number of the plurality of training information bits, or a maximum allowable number of training information bits; and providing a code rate associated with the set of training parameters. In some embodiments, the computer-readable medium further comprises code for causing the first wireless communication device to generate the first communication signal based on the first codeword length and a first encoding of the plurality of information bits; and code for causing the first wireless communication device to generate the second communication signal based on the second codeword length, the first encoding of the plurality of information bits, and a second encoding of the subset of the plurality of information bits. In some embodiments, the computer-readable medium further comprises code for causing the first wireless communication device to recover the plurality of information bits by performing a first decoding on the first communication signal based on the first codeword length; and performing a second decoding on the second communication signal based on the second codeword length. In some embodiments, the computer-readable medium further comprises code for causing the first wireless communication device to communicate, with the second wireless communication device, information associated with at least one of the first codeword length, the second codeword length, the total number of the plurality of information bits, the channel capacity information, or a maximum allowable number of information bits.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:
1. A method of wireless communication, comprising:
   communicating, by a first wireless communication device with a second wireless communication device, a first communication signal including a plurality of information bits;
   determining, by the first wireless communication device, a number of bits in the plurality of information bits to be repeated in a second communication signal based on channel capacity information, wherein the determining includes:
      determining, by the first wireless communication device, a code rate based on at least one of a first modulation order associated with the first communication signal or a second modulation order associated with the second communication signal; and
      determining, by the first wireless communication device, the number of bits based on the code rate; and communicating, by the first wireless communication device with the second wireless communication device, the second communication signal including the plurality of information bits and a repetition of a subset of the plurality of information bits, the subset of the plurality of information bits including the determined number of bits.

2. The method of claim 1, wherein the determining the code rate is further based on at least one of a first signal-to-noise-ratio (SNR) associated with the first communication signal, a second SNR associated with the second communication signal, a first noise parameter associated with first communication signal, or a second noise parameter associated with the second communication signal.

3. The method of claim 1, wherein the determining the code rate is further based on at least one of a first codeword length associated with the plurality of information bits in the first communication signal, a second codeword length associated with the subset of the plurality of information bits in the second communication signal, or a total number of the plurality of information bits.

4. The method of claim 3, wherein the determining the code rate includes:
applying, by the first wireless communication device, a prediction network to at least one of the first codeword length, the second codeword length, the total number of the plurality of information bits, the channel capacity information, or a maximum allowable number of information bits.

5. The method of claim 4, wherein the prediction network is trained by:
providing a set of training parameters including at least one of a second channel capacity parameter, a first training codeword length associated with a first transmission of a plurality of training information bits, a second training codeword length associated with a retransmission of the plurality of training information bits, a number of the plurality of training information bits, or a maximum allowable number of training information bits; and
providing a code rate associated with the set of training parameters.

6. The method of claim 3, further comprising:
generating, by the first wireless communication device, the first communication signal based on the first codeword length, a first encoding of the plurality of information bits, and a first rate match; and
generating, by the first wireless communication device, the second communication signal based on the second codeword length, the first encoding of the plurality of information bits, a second encoding of the subset of the plurality of information bits, and a second rate match.

7. The method of claim 6, wherein the first encoding is based on a first polar code, and wherein the second encoding is based on a second polar code.

8. The method of claim 3, further comprising:
recovering, by the first wireless communication device, the plurality of information bits by: performing a first decoding on the first communication signal based on the first codeword length and a first rate match; and performing a second decoding on the second communication signal based on the second codeword length and a second rate match.

9. The method of claim 8, wherein first decoding is further based on a first polar code, and wherein the second decoding is further based on a second polar code.

10. The method of claim 3, further comprising:
communicating, by the first wireless communication device with the second wireless communication device, information associated with at least one of the first codeword length, the second codeword length, the total number of the plurality of information bits, the channel capacity information, or a maximum allowable number of information bits.

11. The method of claim 1, further comprising:
generating, by the first wireless communication device, the first communication signal based on a first encoding of the plurality of information bits; and
generating, by the first wireless communication device, the second communication signal based on a second encoding of the subset of the plurality of information bits, and an exclusive-or (XOR) between coded bits from the first encoding and coded bits from the second encoding.

12. An apparatus comprising:
a transceiver configured to communicate, with a wireless communication device, a first communication signal including a plurality of information bits; and
a processor configured to determine a number of bits in the plurality of information bits to be repeated in a second communication signal based on channel capacity information, wherein the processor configured to determine the number of bits comprises the processor configured to:
determine a code rate based on at least one of a first modulation order associated with the first communication signal or a second modulation order associated with the second communication signal; and
determine the number of bits based on the code rate
wherein the transceiver is further configured to communicate, with the wireless communication device, the second communication signal including the plurality of information bits and a repetition of a subset of the plurality of information bits, the subset of the plurality of information bits including the determined number of bits.

13. The apparatus of claim 12, wherein the processor is further configured to:
determine the code rate based on at least one of a first signal-to-noise-ratio (SNR) associated with the first communication signal, a second SNR associated with the second communication signal, a first noise parameter associated with first communication signal, or a second noise parameter associated with the second communication signal.

14. The apparatus of claim 12, wherein the processor is further configured to:
determine the code rate based on at least one of a first codeword length associated with the plurality of information bits in the first communication signal, a second codeword length associated with the subset of the plurality of information bits in the second communication signal, or a total number of the plurality of information bits.

15. The apparatus of claim 14, wherein the processor is further configured to:
determine the code rate by applying a prediction network to at least one of the first codeword length, the second codeword length, the total number of the plurality of information bits, the channel capacity information, or a maximum allowable number of information bits, and wherein the prediction network is trained by:
providing a set of training parameters including at least one of a second channel capacity parameter, a first training codeword length associated with a first transmission of a plurality of training information bits, a second training codeword length associated with a retransmission of the plurality of training information bits, a number of the plurality of training information bits, or a maximum allowable number of training information bits; and providing a code rate associated with the set of training parameters.

16. The apparatus of claim 14, wherein the processor is further configured to:
generate the first communication signal based on the first codeword length, a first encoding of the plurality of information bits; and
generate the second communication signal based on the second codeword length, the first encoding of the plurality of information bits, and a second encoding of the subset of the plurality of information bits.

17. The apparatus of claim 14, wherein the processor is further configured to:
recover the plurality of information bits by:
performing a first decoding on the first communication signal based on the first codeword length; and
performing a second decoding on the second communication signal based on the second codeword length.

18. The apparatus of claim 14, further comprising wherein the transceiver is further configured to:
communicate, with the wireless communication device, information associated with at least one of the first codeword length, the second codeword length, the total number of the plurality of information bits, the channel capacity information, or a maximum allowable number of information bits.

19. The apparatus of claim 12, wherein the processor is further configured to:
generate the first communication signal based on a first encoding of the plurality of information bits; and
generate the second communication signal based on a second encoding of the subset of the plurality of information bits and an exclusive-or (XOR) between coded bits from the first encoding and coded bits from the second encoding.

20. An apparatus comprising:
means for communicating, with a wireless communication device, a first communication signal including a plurality of information bits;
means for determining a number of bits in the plurality of information bits to be repeated in a second communication signal based on channel capacity information, wherein the means for determining the number of bits includes:
means for determining a code rate based on at least one of a first modulation order associated with the first communication signal or a second modulation order associated with the second communication signal; and
means for determining the number of bits based on the code rate; and
means for communicating, with the wireless communication device, the second communication signal including the plurality of information bits and a repetition of a subset of the plurality of information bits, the subset of the plurality of information bits including the determined number of bits.

21. The apparatus of claim 20, wherein the means for determining the code rate is further configured to:
determine the code rate based on at least one of a first signal-to-noise-ratio (SNR) associated with the first communication signal, a second SNR associated with the second communication signal, a first noise parameter associated with first communication signal, or a second noise parameter associated with the second communication signal.

22. The apparatus of claim 20, wherein the means for determining the code rate is further configured to:
determine the code rate based on at least one of a first codeword length associated with the plurality of information bits in the first communication signal, a second codeword length associated with the subset of the plurality of information bits in the second communication signal, or a total number of the plurality of information bits.

23. The apparatus of claim 22, wherein the means for determining the code rate is further configured to:
apply a prediction network to at least one of the first codeword length, the second codeword length, the total number of the plurality of information bits, the channel capacity information, or a maximum allowable number of information bits, and
wherein the prediction network is trained by:
providing a set of training parameters including at least one of a second channel capacity parameter, a first training codeword length associated with a first transmission of a plurality of training information bits, a second training codeword length associated with a retransmission of the plurality of training information bits, a number of the plurality of training information bits, or a maximum allowable number of training information bits; and providing a code rate associated with the set of training parameters.

24. The apparatus of claim 22, further comprising:
means for generating the first communication signal based on the first codeword length and a first encoding of the plurality of information bits; and
means for generating the second communication signal based on the second codeword length, the first encoding of the plurality of information bits, a second encoding of the subset of the plurality of information bits, and an exclusive-or (XOR) between coded bits from the first encoding and coded bits from the second encoding.

25. The apparatus of claim 22, further comprising:
means for recovering the plurality of information bits by:
performing a first decoding on the first communication signal based on the first codeword length; and
performing a second decoding on the second communication signal based on the second codeword length.

26. The apparatus of claim 22, further comprising:
means for communicating, with the wireless communication device, information associated with at least one of the first codeword length, the second codeword length, the total number of the plurality of information bits, the channel capacity information, or a maximum allowable number of information bits.

* * * * *